United States Patent
Whetsel

(10) Patent No.: US 8,234,529 B2
(45) Date of Patent: *Jul. 31, 2012

(54) HTMLS WITH FIRST AND SECOND SELECT OUTPUTS AND ENABLE INPUTS

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/103,540

(22) Filed: May 9, 2011

(65) Prior Publication Data

US 2011/0214028 A1    Sep. 1, 2011

Related U.S. Application Data

(62) Division of application No. 12/830,933, filed on Jul. 6, 2010, now Pat. No. 7,962,815, which is a division of application No. 11/626,710, filed on Jan. 24, 2007, now Pat. No. 7,774,664, which is a division of application No. 10/962,950, filed on Oct. 12, 2004, now Pat. No. 7,185,250, which is a division of application No. 10/172,568, filed on Jun. 14, 2002, now Pat. No. 6,975,980, which is a division of application No. 09/252,573, filed on Feb. 18, 1999, now Pat. No. 6,408,413.

(60) Provisional application No. 60/075,035, filed on Feb. 18, 1998.

(51) Int. Cl.
*G01R 31/28* (2006.01)
(52) U.S. Cl. ............................................ 714/727
(58) Field of Classification Search .................. None
See application file for complete search history.

*Primary Examiner* — Guerrier Merant
(74) *Attorney, Agent, or Firm* — Lawrence J. Bassuk; W. James Brady; Frederick J. Telecky, Jr.

(57) ABSTRACT

An integrated circuit can have plural core circuits, each having a test access port that is defined in IEEE standard 1149.1. Access to and control of these ports is though a test linking module. The test access ports on an integrated circuit can be arranged in a hierarchy with one test linking module controlling access to plural secondary test linking modules and test access ports. Each secondary test linking module in turn can also control access to tertiary test linking modules and test access ports. The test linking modules can also be used for emulation.

1 Claim, 13 Drawing Sheets

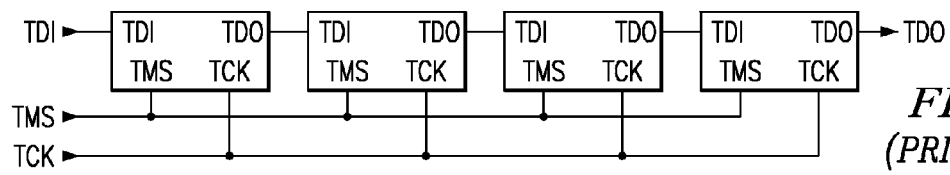
*FIG. 13*
*(PRIOR ART)*
*FIG. 14*
*(PRIOR ART)*
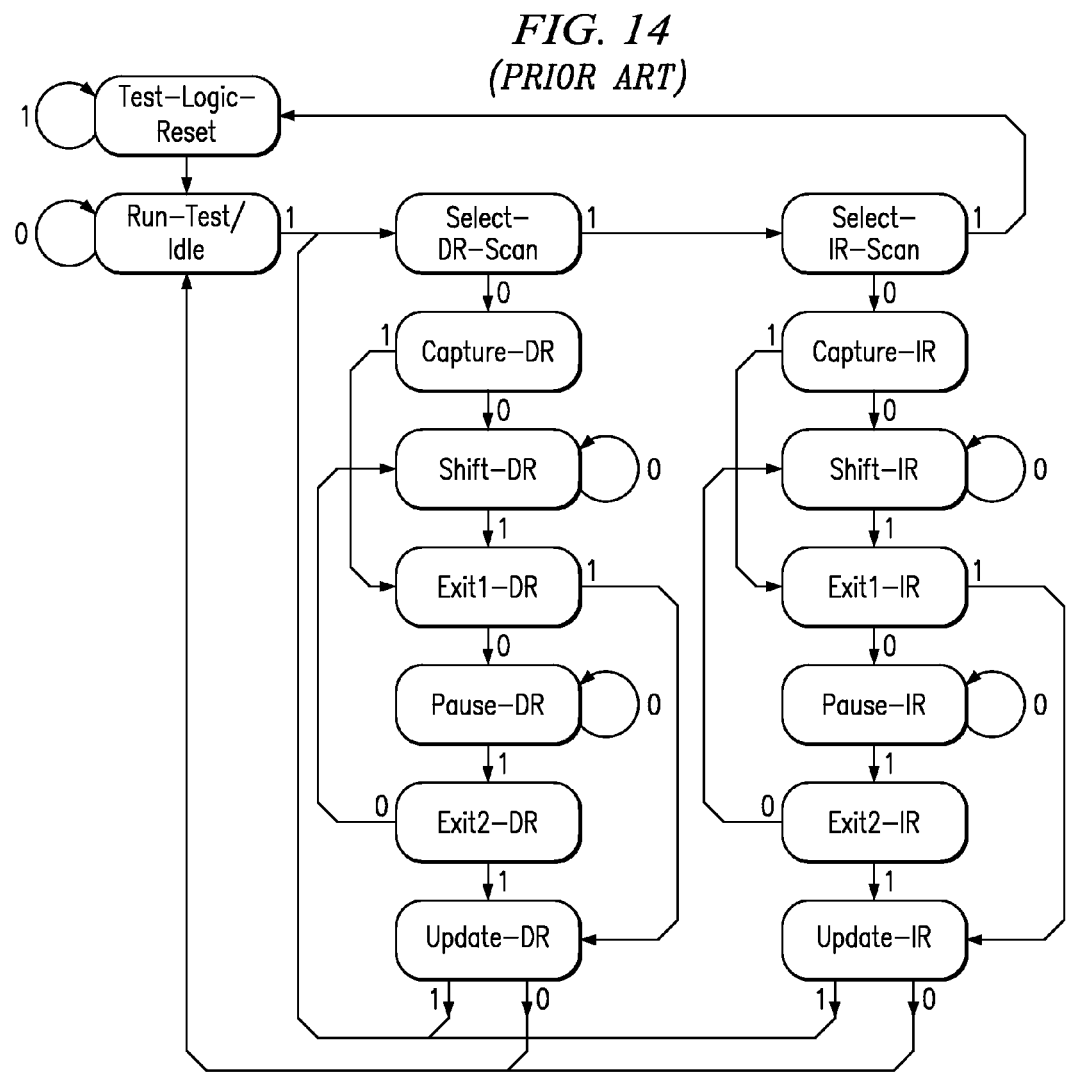
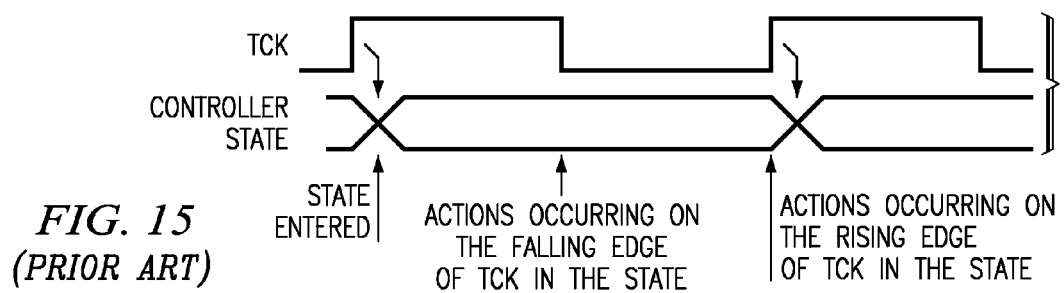
*FIG. 15*
*(PRIOR ART)*

| INSTRUCTION | SRB3 | SRB2 | SRB1 | BR | BSR | MODE | HIGHZ | BENA | REGSEL |
|---|---|---|---|---|---|---|---|---|---|
| Bypass | 0 | 0 | 0 | 1 | 0 | 0 | 0 | 0 | 0 |
| Sample | 0 | 0 | 1 | 0 | 1 | 0 | 0 | 0 | 1 |
| HighZ | 0 | 1 | 0 | 1 | 0 | 0 | 1 | 0 | 0 |
| Clamp | 0 | 1 | 1 | 1 | 0 | 1 | 0 | 0 | 0 |
| RunBIST | 1 | 0 | 0 | 0 | 1 | 1 | 0 | 1 | 1 |
| Extest | 1 | 1 | 1 | 0 | 1 | 1 | 0 | 0 | 1 |

| INSTRUCTION | SRB4 | SRB3 | SRB2 | SRB1 | BR | BSR | MODE | HIGHZ | BENA | REGSEL | SEL |
|---|---|---|---|---|---|---|---|---|---|---|---|
| Bypass TLM not Selected | 0 | 0 | 0 | 0 | 1 | 0 | 0 | 0 | 0 | 0 | 0 |
| Sample TLM not Selected | 0 | 0 | 0 | 1 | 0 | 1 | 0 | 0 | 0 | 1 | 0 |
| HighZ TLM not Selected | 0 | 0 | 1 | 0 | 1 | 0 | 0 | 1 | 0 | 0 | 0 |
| Clamp TLM not Selected | 0 | 0 | 1 | 1 | 1 | 0 | 1 | 0 | 0 | 0 | 0 |
| RunBIST TLM not Selected | 0 | 1 | 0 | 0 | 0 | 1 | 1 | 0 | 1 | 1 | 0 |
| Extest TLM not Selected | 1 | 1 | 1 | 1 | 0 | 1 | 1 | 0 | 0 | 1 | 0 |
| Bypass TLM Selected | 1 | 0 | 0 | 0 | 0 | 0 | 0 | 0 | 0 | 0 | 1 |
| Sample TLM Selected | 1 | 0 | 0 | 1 | 0 | 0 | 0 | 0 | 0 | 1 | 1 |
| HighZ TLM Selected | 1 | 0 | 1 | 0 | 0 | 0 | 0 | 1 | 0 | 0 | 1 |
| Clamp TLM Selected | 1 | 0 | 1 | 1 | 0 | 0 | 1 | 0 | 0 | 0 | 1 |
| RunBIST TLM Selected | 1 | 1 | 0 | 0 | 0 | 0 | 1 | 0 | 1 | 1 | 1 |
| Extest TLM Selected | 1 | 1 | 0 | 1 | 0 | 0 | 1 | 0 | 0 | 1 | 1 |

*FIG. 24*
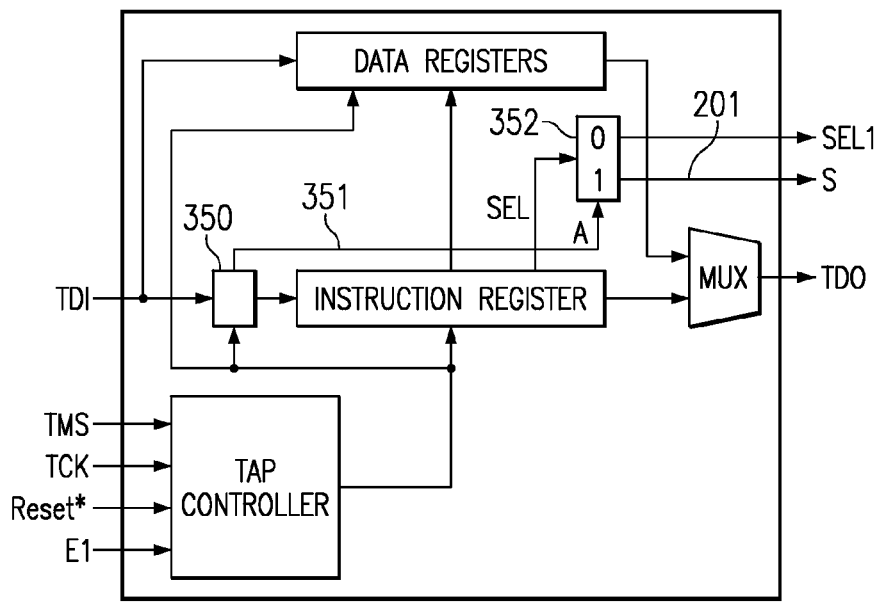
*FIG. 25*
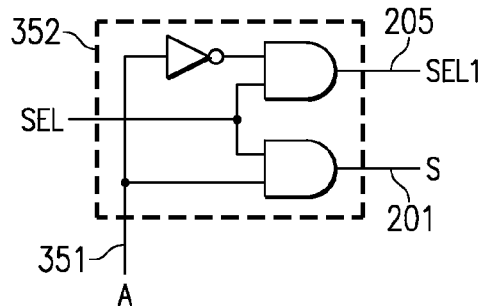
*FIG. 26*
| A | INSTRUCTION | SEL | |
|---|---|---|---|
| X | 0010 | 0 | HighZ HTLM not Selected (SEL1=0, S=0)) |
| 0 | 1010 | 1 | HighZ Internal HTLM Selected (SEL1=1, S=0) |
| 1 | 1010 | 1 | HighZ External TLM Selected (SEL1=0, S=1) |
| X | 0011 | 0 | Clamp HTLM not Selected (SEL1=0, S=0) |
| 0 | 1011 | 1 | Clamp Internal HTLM Selected (SEL1=1, S=0) |
| 1 | 1011 | 1 | Clamp External HTLM Selected (SEL1=0, S=1) |
| X | 0100 | 0 | RunBist HTLM not Selected (SEL1=0, S=0) |
| 0 | 1100 | 1 | RunBist Internal HTLM Selected (SEL1=1, S=0) |
| 1 | 1100 | 1 | RunBist External HTLM Selected (SEL1=0, S=1) |

HTMLS WITH FIRST AND SECOND SELECT OUTPUTS AND ENABLE INPUTS

This application is a divisional of prior application Ser. No. 12/830,933, filed Jul. 6, 2010, now U.S. Pat. No. 7,962,815, issued Jun. 14, 2011;
Which was a divisional of prior application Ser. No. 11/626,710, filed Jan. 24, 2007, now U.S. Pat. No. 7,774,664, issued Aug. 10, 2010; Which was a divisional of prior application Ser. No. 10/962,950, filed Oct. 12, 2004, now U.S. Pat. No. 7,185,250, issued Feb. 27, 2007; which was a divisional of prior application Ser. No. 10/172,568, filed Jun. 14, 2002, now U.S. Pat. No. 6,975,980, issued Dec. 13, 2005; which was a divisional of prior application Ser. No. 09/252,573, filed Feb. 18, 1999, now U.S. Pat. No. 6,408,413, issued Jun. 18, 2002; which claims priority from Provisional Application No. 60/075,035, filed Feb. 18, 1998.

FIELD OF THE INVENTION

The invention relates generally to evaluation of the functionality of electronic integrated circuits and, more particularly, to improvements in the control and design of test access ports (TAPs) within integrated circuits.

BACKGROUND OF THE INVENTION

The IEEE Standard Test Access Port and Boundary Scan Architecture (IEEE STD 1149.1) is a well known IEEE test standard that provides scan access to scan registers within integrated circuits (ICs), and is hereby incorporated herein by reference. FIG. 12 shows a schematic of the 1149.1 test logic. The test logic comprises a TAP controller 120, an instruction register, and plural test data registers. The TAP controller is connected to test mode select (TMS), test clock (TCK), and test reset (TRST*) pins. The TAP controller responds to control input on TCK and TMS to scan data through either the instruction or data registers, via the test data input (TDI) and test data output (TDO) pins. TRST* is an optional pin used to reset or initialize the test logic, i.e. TAP controller, instruction register, and data registers. The inputs to the instruction and data registers are both directly connected to the TDI input pin. The output of the instruction and data registers are multiplexed to the TDO pin. During instruction register scans, the TAP controller causes the multiplexer 121 to output the instruction register on TDO. During data register scans, the TAP controller causes the multiplexer 121 to output the data register on TDO. The instruction scanned into the instruction register selects which one of the plural data registers will be scanned during a subsequent data register scan operation. When the TAP controller is scanning data through the instruction or data registers, it outputs control to enable the output stage to output data from the TDO pin, otherwise the TAP controller disables the output stage.

FIG. 13 shows how four ICs, each IC including the TAP controller, instruction register, and data registers of FIG. 12, would be connected at the board level for serial data transfer (TDI, TDO) and parallel control (TMS, TCK).

FIG. 14 shows the state diagram operation of the FIG. 12 TAP controller. The TAP controller is clocked by TCK and responds to TMS input to transition between its states. The logic state of TMS is shown beside the paths connecting the states of FIG. 14. The Test Logic Reset state is where the TAP controller goes to in response to a power up reset signal, a low on TRST*, or an appropriate TMS input sequence. From Test Logic Reset the TAP controller can transition to the Run Test/Idle state. From the Run Test/Idle state the TAP controller can transition to the Select DR Scan state. From the Select DR Scan state, the TAP controller can transition into a data register scan operation or to the Select IR scan state. If the transition is to the data register scan operation, the TAP controller transitions through a Capture DR state to load parallel data into a selected data register, then shifts the selected data register from TDI to TDO during the Shift DR state. The data register shift operation can be paused by transitioning to the Pause DR state via the Exit1 DR state, and resumed by returning to the Shift DR state via the Exit2 DR state. At the end of the data register shift operation, the TAP controller transitions through the Update DR state to update (output) new parallel data from the data register and thereby complete the data register scan operation. From the Update DR state, the TAP controller can transition to the Run Test/Idle state or to the Select DR Scan state.

If the Select IR Scan state is entered from the Select DR Scan state, the TAP controller can transition to the Test Logic Reset state or transition into an instruction register scan operation. If the transition is to an instruction register scan operation, Capture IR, Shift IR, optional Pause IR, and Update IR states are provided analogously to the states of the data register scan operation. Next state transitions from the Update IR state can be either the Run Test/Idle state or Select DR Scan state. If the TAP controller transitions from the Select IR Scan state into the Test Logic Reset state, the TAP controller will output a reset signal to reset or initialize the instruction and data registers.

FIG. 15 shows that state transitions of the FIG. 12 TAP controller occur on the rising edge of the TCK and that actions can occur on either the rising or falling edge of TCK while the TAP controller is in a given state.

The term TAP referred to hereafter will be understood to comprise a TAP controller, an instruction register, test data registers, and TDO multiplexing of the general type shown in FIG. 12, but differing from FIG. 12 according to novel features of the present invention described with particularity herein. The 1149.1 standard was developed with the understanding that there would be only one TAP per IC. Today, ICs may contain multiple TAPs. The reason for this is that ICs are being designed using embedded megamodule cores which contain their Own TAPs. A megamodule is a complete circuit function, such as a DSP, that has its own TAP and can be used as a subcircuit within an IC or as a standalone IC. An IC that contains multiple megamodules therefore has multiple TAPs.

SUMMARY OF THE INVENTION

In example FIG. 1, an IC 10 containing four TAPs is shown. TAP1 is shown connected to the boundary scan register (BSR) to provide the 1149.1 standard's conventional board level interconnect test capability. TAP1 can also be connected to other circuitry within the IC that exists outside the megamodules. TAP2 is an integral part of megamodule MM1. Likewise TAP3 and TAP4 are integral parts of megamodules MM2 and MM3. Each TAP of FIG. 1 includes a conventional 1149.1 TAP interface 11 for transfer of control (TMS, TCK and TRST) and data (TDI and TDO) signals. However, the 1149.1 standard is designed for only one TAP to be included inside an IC, and for the 1149.1 TAP interface of this one TAP to be accessible externally of the IC at terminals (or pins) of the IC for connection via 1149.1 test bus 13 to an external test controller.

It is therefore desirable to provide an architecture wherein all TAPs of an IC can be controlled and accessed from an external 1149.1 test bus via a single externally accessible 1149.1 TAP interface.

The present invention provides an architecture which permits plural TAPs to be selectively accessed and controlled from a single 1149.1 TAP interface. The invention further provides access to a single register via any selected one of a plurality of TAPs. The invention further provides a TAP controller whose state machine control can be selectively overridden by an externally generated override signal which drives the state machine synchronously to a desired state. The invention further provides a TAP instruction which is decodable to select an external data path. Also according to the invention, sequential access of TAPs from a single 1149.1 TAP interface permits test operations associated with different TAPs to timewise overlap each other. The invention further provides first and second TAPs, wherein the TAP controller of the second TAP assumes a predetermined state responsive to the TAP controller of the first TAP progressing through a predetermined sequence of states.

BRIEF DESCRIPTION OF THE DRAWINGS

FIG. 13 illustrates a plurality of integrated circuits connected in a conventional manner for 1149.1 testing;

FIG. 14 is a state diagram associated with the conventional TAP controller of FIG. 12;

FIG. 15 is a timing diagram which illustrates when state changes and other actions can occur in the conventional TAP architecture of FIG. 12;

FIG. 24 is an electrical diagram, in block form, illustrating the placement and arrangement of scan cell circuitry for providing the hierarchical TAP access according to the preferred embodiment of the invention.

FIG. 25 is an electrical diagram, in schematic form, of a demultiplexer used in the circuitry of FIG. 24 according to the preferred embodiment of the invention.

FIG. 26 contains Table 1

DETAILED DESCRIPTION OF THE INVENTION

Figure 1:
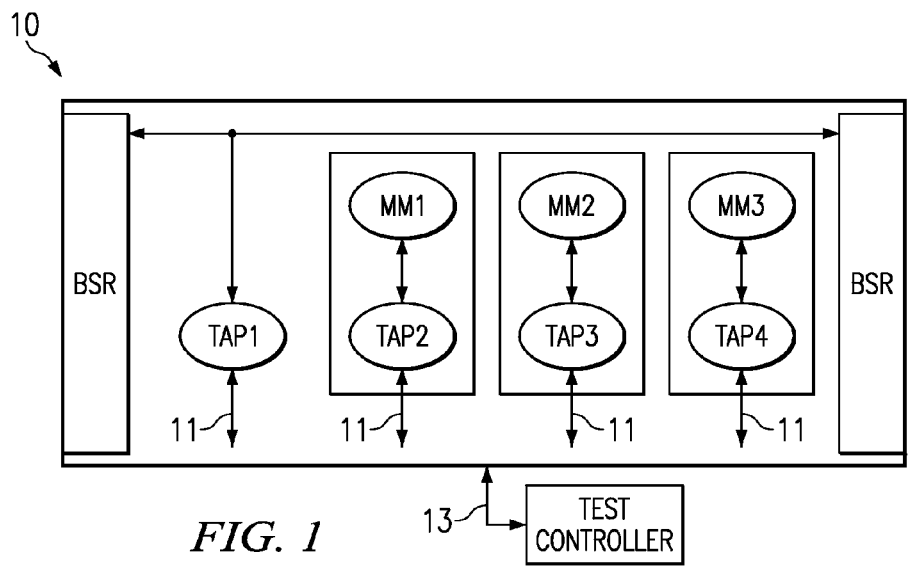
FIG. 1 illustrates a test controller connected to an integrated circuit having multiple TAPs therein.
Figure 2:
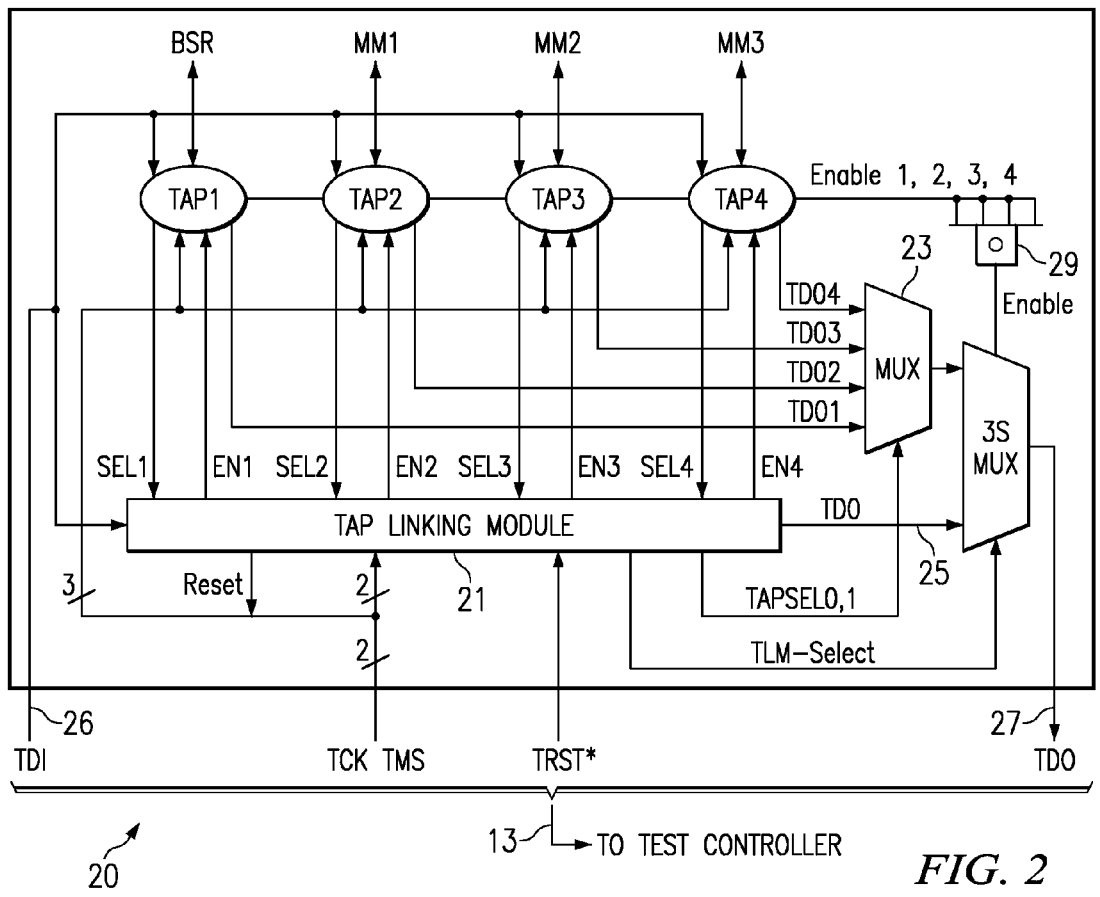
FIG. 2 illustrates an integrated circuit having multiple TAPs therein according to the present invention.

FIG. 2 shows an exemplary IC according to the invention, including a TAP Linking Module (TLM) 21 which is coupled to each TAP via select (SEL1-4) and enable (EN1-4) signals, and to an externally accessible 1149.1 interface 20 including TDI, TCK, TMS, TRST*, and TDO pins. The TAPs are connected to the TCK and TMS pins and to the Reset output from the TLM. The SEL1-4 signals are outputs from the TAPs to the TLM, and the EN1-4 signals are output from the TLM to the TAPs. Each TAP's select signal is output in response to a special instruction scanned into its instruction register. The instruction sets the select output from the TAP high, which causes the TLM to be selected as the data register scan path between the IC's TDI and TDO pins 26 and 27. A conventional data register scan operation is used to capture data into and then shift data through the TLM from TDI to TDO. During such a TLM scan operation, the TLM Select output signal from TLM makes a connection from the TLM's TDO output 25 to the ICs TDO output 27, via the multiplexer 3SMUX. Also during a TLM scan operation, an Enable output from the currently enabled TAP (one of Enable 1,2,3,4) enables a TDO output buffer (in 3SMUX via OR gate 29. This is analogous to enabling the output stage in FIG. 12. Following the TLM scan operation, TLM outputs EN1-4 signals to the TAPs and TAPSEL0-1 signals to the multiplexer 23 to establish a TAP link configuration. The data scanned into the TLM selects one of the four outputs EN1-4 to be active to enable the corresponding one of the TAPs. Also the TAPSEL0-1 and TLM-Select signals will cause the TDO of the enabled TAP (one of TDO1-TDO4) to be connected to the IC's TDO pin 27.

From this description it is seen that the TLM 21 operates to selectively enable one of the TAPs to be accessed via the IC's 1149.1 test pins. The circuit coupled to the enabled TAP (BSR, MM1, MM2, MM3) can therefore be accessed directly from the 1149.1 test pins. A presently enabled TAP can select and scan the TLM 21 which in turn will select and enable another TAP. When another TAP is enabled, the previously enabled TAP is disabled and remains so until it is enabled again by the TLM. The EN1-4 inputs to the TAPs can enable or disable the TAPs in many ways. For example, the EN1-4 inputs could simply be used to gate TCK on and off. Alternatively and preferably, the EN1-4 inputs could be included in the designs of the TAP controller state machines to keep the TAP in its Run-Test/Idle state when disabled. This preferred method of using the EN1-4 signals is described below in connection with FIGS. 9 and 9A.

Figure 3:
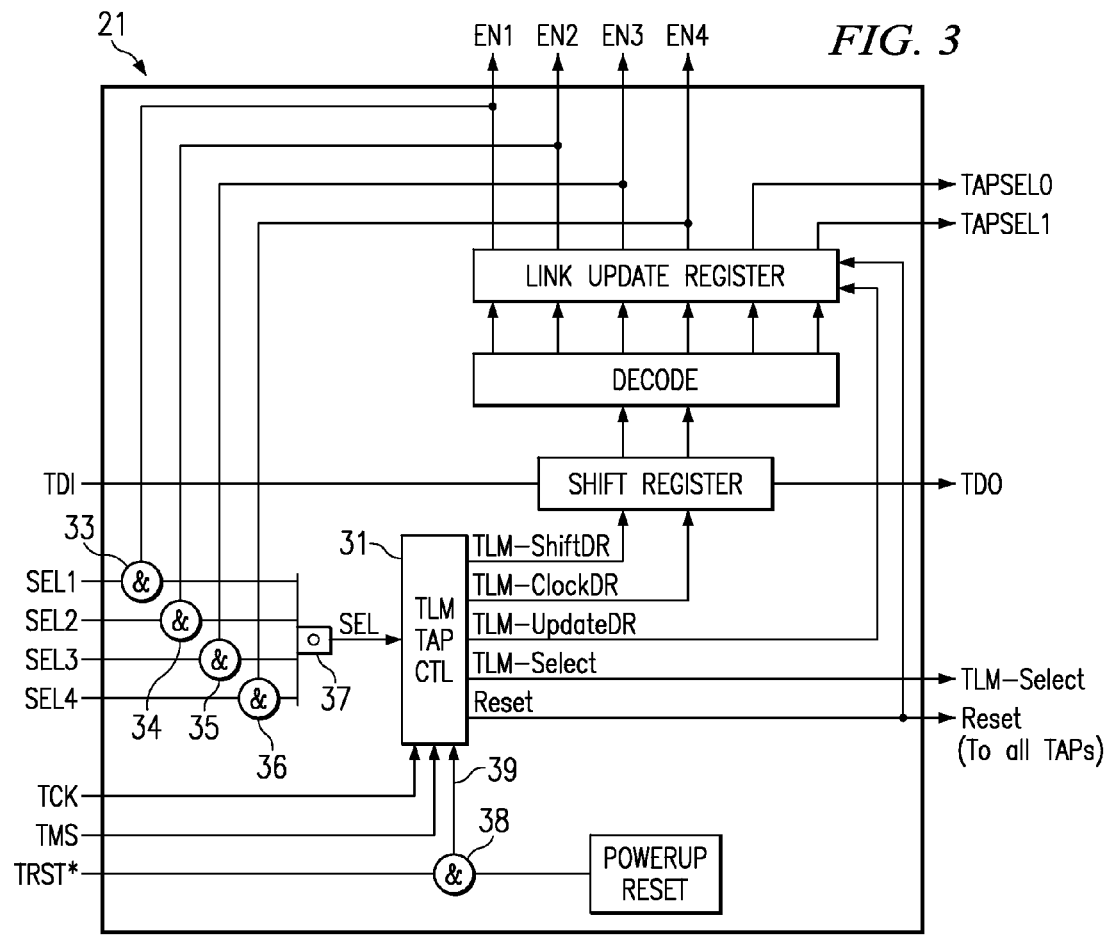
FIG. 3 illustrates the TAP Linking Module of FIG. 2 in greater detail.

FIG. 3 shows one circuit example implementation of TLM 21. The circuit comprises a TLM TAP controller 31, a 2-bit shift register, decode logic, and a link update register. The TLM TAP controller 31 is always enabled to follow the test bus protocol on the TCK and TMS pins, i.e. the TLM TAP controller is always synchronized to the state of the 1149.1 test bus 13 connected to the TCK and TMS pins. However, the outputs of the TLM TAP controller (i.e. TLM-ShiftDR, TLM-ClockDR, TLM-UpdateDR, and TLM-Select) are only enabled during a data register scan operation and only if the select input (SEL1-4) from the currently enabled TAP is high.

If the currently enabled TAP inputs a high select input at one of SEL1-4, the TLM TAP controller 31 will respond to TCK and TMS to output control on TLM-ShiftDR, TLM-ClockDR, and TLM-Select to capture and shift data through the 2-bit shift register, and then output TLM-UpdateDR control to update the decoded output from the shift register to the link update register. This capture, shift, and update operation is a well known TAP controller scan operation taught in IEEE STD 1149.1 and shown in FIGS. 5-1 and 5-7 thereof. During this scan operation, the TLM TAP controller outputs TLM-Select control to couple the TDO output of TLM 21 to the IC's TDO pin 27, via the 3SMUX of FIG. 2. Also during the scan operation, the output of the 3SMUX is activated by the enabled TAP (one of Enable1-4) to output data on the IC's TDO pin 27. The data from the link update register is output as EN1-4 and TAPSEL0-1 to enable the desired TAP and its TDO connection (one of TDO1-4) to the IC's TDO pin 27. The active one of enable signals EN1-4 qualifies a corresponding one of select signals SEL1-4 at one of AND gates 33-36, whereby the corresponding one of SEL1-4 can be input to the TLM TAP controller via the OR gate 37. Select signals from disabled TAPs are gated off by the AND gates associated with the inactive ones of enable signals EN1-4. The decode from the 2-bit shift register allows each of TAP1, TAP2, TAP3, or TAP4 to be individually selected, accessed, controlled and scanned from the 1149.1 pins at 20.

Figure 4:
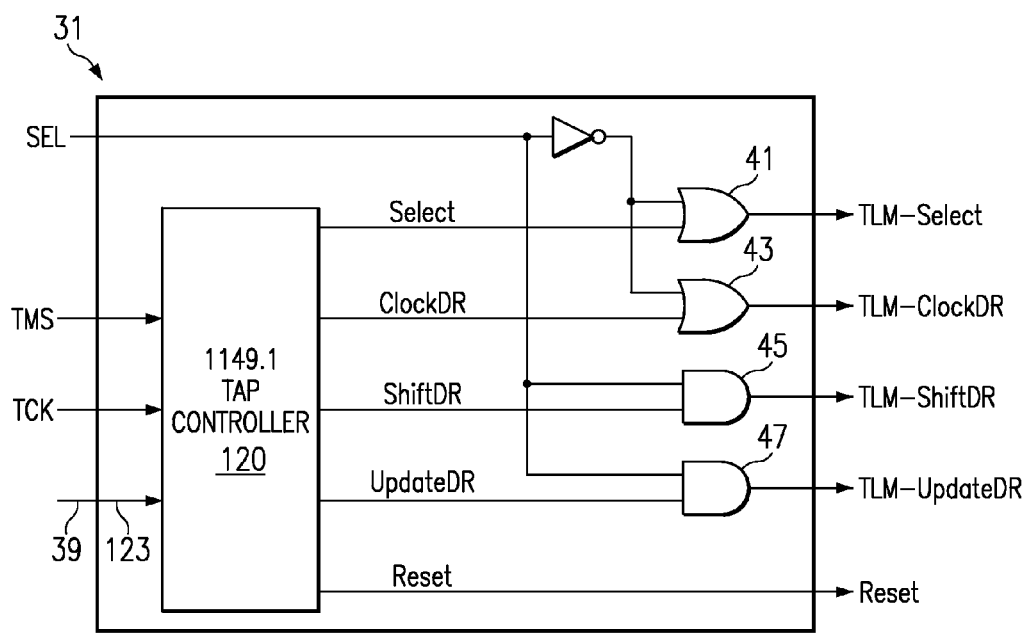
FIG. 4 illustrates the TLM TAP Controller of FIG. 3 in greater detail.

Exemplary FIG. 4 shows a detail view of the TLM TAP controller 31. The TLM TAP controller comprises the conventional 1149.1 TAP controller 120 of FIG. 12 and gating to enable or disable the TLM-Select, TLM-ClockDR, TLM-ShiftDR, and TLM-UpdateDR outputs of the TLM TAP controller. After power up reset, the 1149.1 TAP controller 120 is always synchronized to the state of the 1149.1 test bus. Note that the output signal 39 of the FIG. 3 AND gate 38 is connected to 1149.1 TAP controller 120 at input node 123 thereof where the TRST* signal would conventionally be connected (contrast FIG. 12). The 1149.1 TAP controller's conventional outputs are gated off by the OR gates 41 and 43, and AND gates 45 and 47 so that the state of the TLM's shift register and link update register are not disturbed during data register scans occurring while the SEL input from OR gate 37 (FIG. 3) is low. TLM-Select and TLM-ClockDR are high while SEL is low, and TLM-UpdateDR and TLM-ShiftDR are low while SEL is low. These output conditions match what the conventional 1149.1 TAP controller 120 would output on the analogous signal types (i.e. Select, ClockDR, ShiftDR, UpdateDR) when data register scans are not being performed. When the SEL input is high, the gated outputs from the TLM TAP controller follow the conventional 1149.1 TAP controller outputs. The Reset output from the TLM TAP controller is always enabled to output the conventional 1149.1 Reset signal to the TAPs within the IC. The TLM TAP controller can be viewed as the master TAP controller in the IC since it has reset authority over all other TAPs.

When the TLM TAP controller is reset (i.e. forced to the Test Logic Reset state of FIG. 14) by the power up reset circuit, or by activation of the TRST* pin, or by an appropriate TMS sequence, it outputs a Reset signal. Either the power-up reset circuit or the TRST* signal can drive the output 39 of AND gate 38 (see FIG. 3) low and thereby force the Test Logic Reset state. An appropriate sequence of logic 1's on TMS can also put the TLM TAP controller in the Test Logic Reset state (see FIG. 14). Internal to the TLM 21, the Reset signal loads the link update register with EN1 and appropriate TAPSEL0-1 control (see FIG. 3) to enable and link TAP1 between the TDI pin 26 and 3SMUX (see FIG. 2). TLM Select is driven high when controller 31 is in the Test Logic Reset state because the Select output from the conventional 1149.1 TAP controller 120 goes high in the Test Logic Reset state. When TLM Select is high, the output of MUX 23 is connected to TDO pin 27 via 3SMUX. By initially selecting TAP1 to be active, the IC appears to test bus 13 to be operating as would a one-TAP IC described in the 1149.1 standard. Following the initial selection of TAP1, the TLM can be selected by TAP1 and then scanned to select any other TAP in the IC to become the active TAP. External to the TLM 21, the Reset signal initializes all the TAPs to the Test Logic Reset state of FIG. 14.

Figure 5:
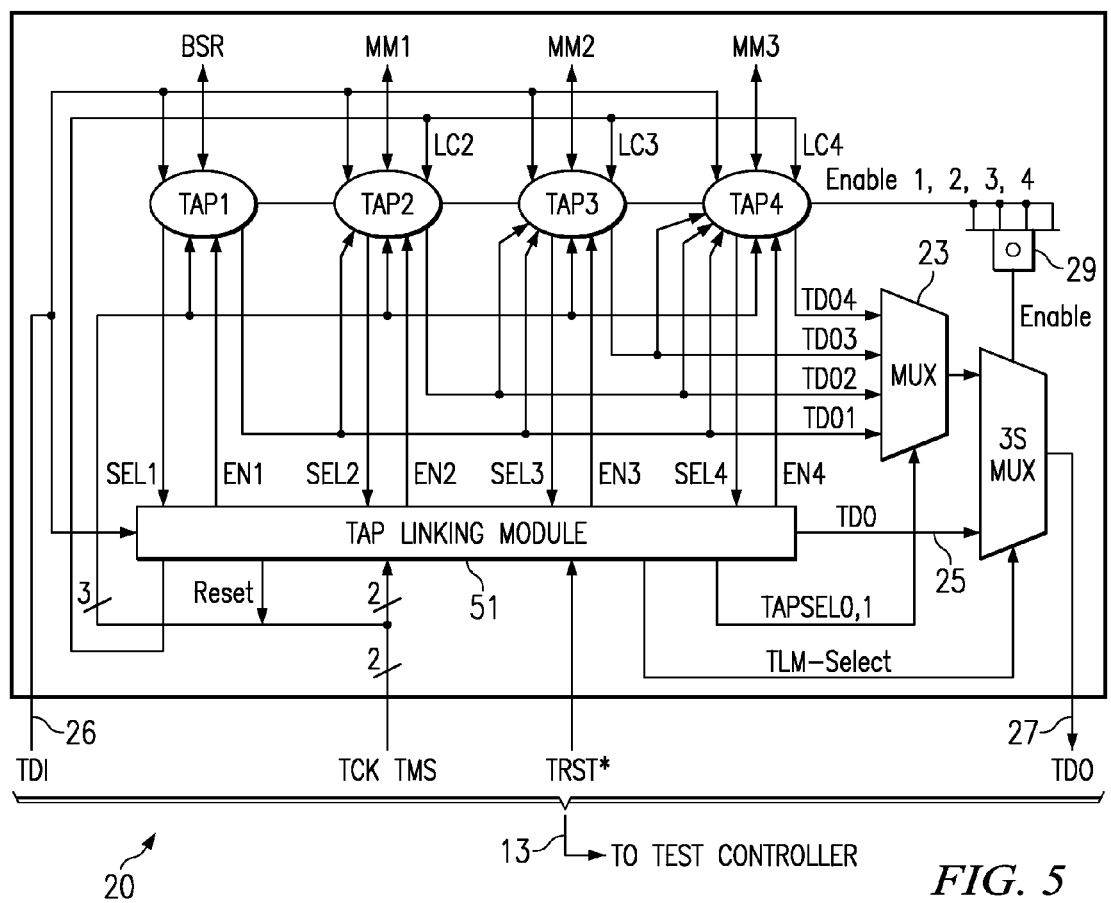
FIG. 5 illustrates another exemplary integrated circuit having multiple TAPs therein according to the present invention.

FIG. 5 shows another example IC according to the invention, including a TAP Linking Module (TLM 51) which is coupled to TAPs, 1149.1 test pins, and multiplexers similarly to FIG. 2. Additionally, the TLM 51 is coupled to the TAPs 2-4 via Link Control (LC2-4) signals. The operation of TLM 51 is similar to TLM 21 of FIG. 2, except: (1) the TLM 51 can be loaded with data to enable more than one TAP at a time in the IC; and (2) the TLM 51 outputs link control to the TAPs to allow linking the TAPs together in different arrangements within a single scan path between the TDI 26 and TDO 27 pins. The linking and enabling of multiple selected TAPs permits the circuits associated with the TAPs (BSR, MM1, MM2, MM3) to be accessed at the same time.

In FIG. 5 it is seen that TAPs 2-4 have multiple scan inputs. In particular, the TAPs 2-4 have scan inputs as follows: TAP2 has TDI pin 26 and TDO1; TAP3 has TDI pin 26, TDO1 and TDO2; and TAP4 has TDI pin 26, TDO1, TDO2 and TDO3. This is to allow for serially concatenating enabled TAPs together in different ways. For example TAP1 and TAP4 can be enabled at the same time and linked together into the serial path between TDI 26 and TDO 27. In this arrangement, TAP1 and TAP4 can participate together during test while TAP2 and TAP3 are disabled. The Link Control signals LC2-4 to TAPs 2-4 select the appropriate scan input to the TAPs to make a particular serial link between TAPs. TLM 51 can provide the following TAP linking arrangements between TDI 26 and TDO 27:

TAP1 Links: TAP1, TAP1&2, TAP1&3, TAP1&4, TAP1,2&3, TAP1,2,&4, TAP1,2,3&4, TAP1,3&4

TAP2 Links: TAP2, TAP2&3, TAP2&4, TAP2,3&4

TAP3 Links: TAP3, TAP3&4

TAP4 Links: TAP4

The more scan inputs per TAP, the more possible linking arrangements. For example, TAP3 could also have TDO4 as a scan input in addition to those shown in FIG. 5. The multiplexing circuitry associated with the multiple scan inputs of the FIG. 5 TAPs is not shown in FIG. 5 for clarity, but an example is described below relative to FIG. 8.

Figure 6:
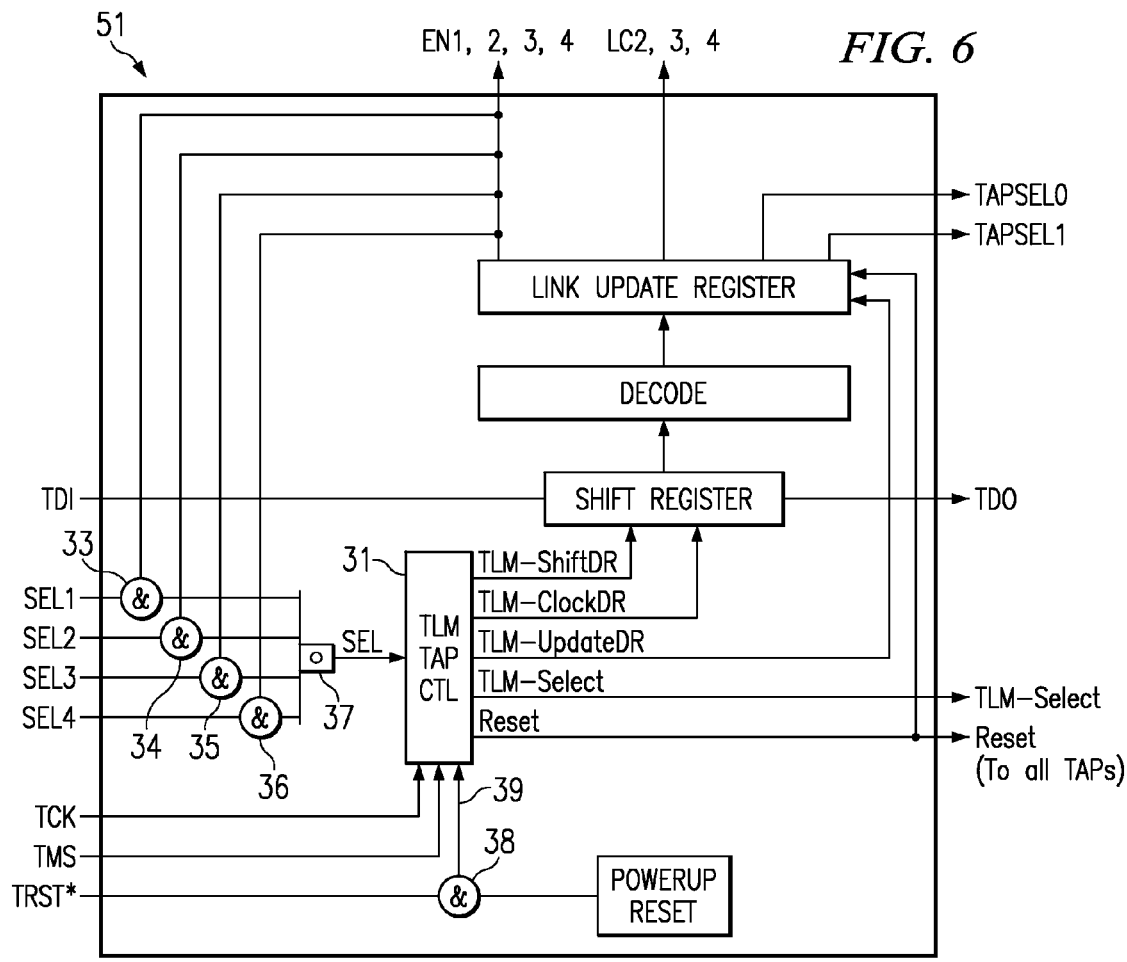
FIG. 6 illustrates in greater detail the TAP Linking Module of FIG. 5.

FIG. 6 shows one circuit example implementation of the TLM 51. The TLM 51 is similar to the TLM 21 of FIG. 3 except: (1) the shift register is longer due to the additional decode required for linking multiple TAPs; (2) the decode circuit and link update register provide additional output for link controls LC2-4; and (3) select inputs from all enabled and linked TAPs will be qualified by the corresponding active enable signals for input to the TLM TAP controller 31 via the AND and OR gates 33-37.

Figure 7:
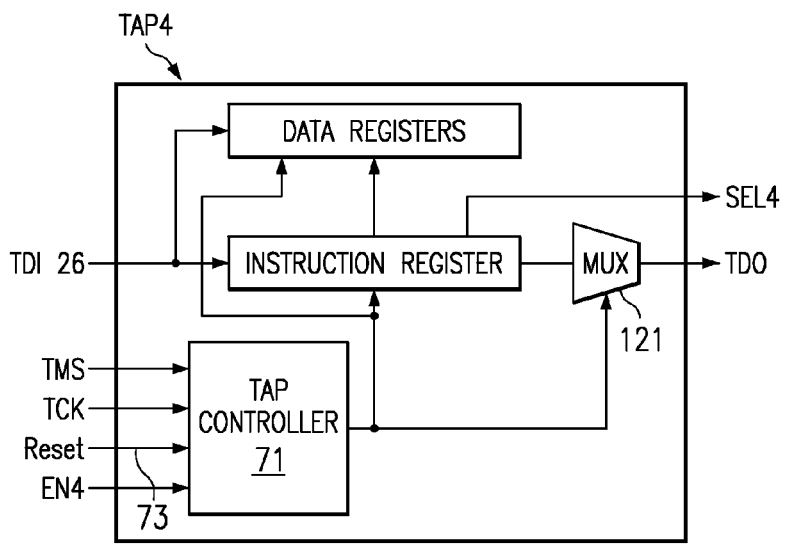
FIG. 7 illustrates TAP4 of FIGS. 2 and 5 in greater detail.

Example FIG. 7 shows a portion of the design of TAP4 of FIG. 2. The other TAPs of FIG. 2 can be analogously designed. The TAP controller 71 includes an input for the EN4 signal from the TLM 21, which is used to enable or disable the TAP controller 71. Also, TAP controller 71 has an input 73 connected to the Reset output from the TLM 21 to provide global reset of all TAPs. The TAP4 instruction register decode includes the SEL4 output to the TLM 21. Also, an instruction is provided to allow setting the SEL4 output high to enable scan access of the TLM 21.

Figure 8:
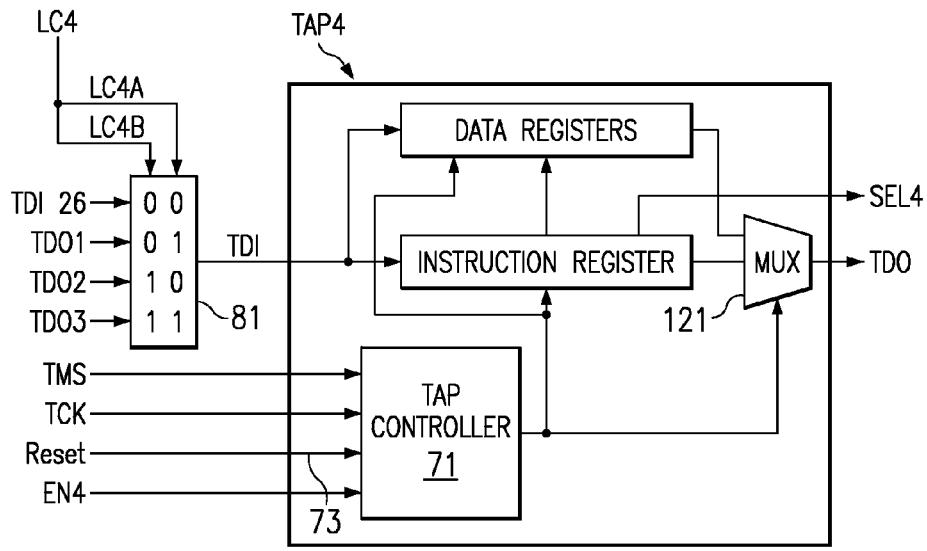
FIG. 8 illustrates multiplexing circuitry associated with the scan input of TAP4 of FIG. 5.

Example FIG. 8 shows TDI pin 26, TDO1, TDO2 and TDO3 multiplexed onto the scan input of TAP4 to support the design of FIG. 5. The scan inputs of the other TAPs of FIG. 5 are multiplexed analogously. In this example, a 4:1 multiplexer 81 is connected to the TLM 51 via two link control signals LC4A and LC4B to control which scan input (TDI pin 26, TDO1, TDO2, or TDO3) is connected to the TAP's TDI input.

Figure 9:
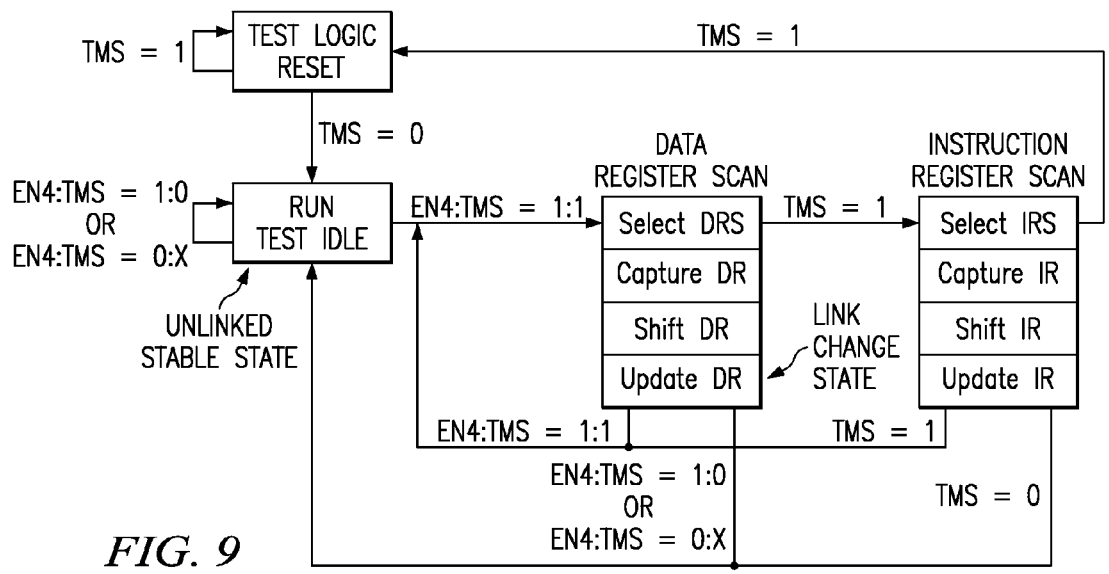
FIG. 9 shows a state diagram associated with the TAP controller of FIG. 7.

FIG. 9 shows an example TAP controller design to support enabling and disabling TAPs 1-4 of FIGS. 2 and 5 using the EN1-4 outputs from either TLM 21 or TLM 51. The TAP controller state diagram of FIG. 9 corresponds to the TAP controller 71 of FIG. 7, and includes a Run Test/Idle state wherein the enable signal (in this case EN4) is evaluated along with the TMS signal to determine the next state transition. In the Run Test/Idle state of FIG. 9, the next state will always be the Run Test/Idle state if EN4 is low, regardless of the logic level on TMS. If EN4 is high, the next state from Run Test/Idle is determined by the logic level on TMS. In the UpdateDR state the EN4 signal is evaluated along with the TMS signal to determine the next state transition. In the UpdateDR state of FIG. 9, the next state will always be Run Test/Idle if EN4 is low, regardless of the logic level on TMS. If EN4 is high, the next state from UpdateDR is determined by the logic level on TMS. Although FIG. 9 illustrates an example state diagram for the TAP controller of TAP4, TAPs 1-3 can be analogously designed.

The Run Test/Idle state of FIG. 9 provides, in addition to its conventional run test or idle functions, a stable state for the TAP controller to assume and remain in when it is not enabled to be linked to the 1149.1 test bus pins. Using the Run Test/Idle state as the stable state for unlink is advantageous because one well known method of initialing test operations associated with a given instruction is to transition the TAP into Run Test/Idle with the given instruction in the instruction register. An example of this advantage of using Run Test/Idle as the stable state for unlink is described hereinbelow with respect to the RunBist instruction.

The UpdateDR state of FIG. 9 provides, in addition to its conventional data update function, a link change state where a presently enabled TAP controller gets disabled and goes to the Run Test/Idle state while a new TAP controller becomes enabled to follow the ICs test bus pins.

For example, in FIG. 2 and after a Reset, the TLM TAP controller 31 and all the TAP controllers of TAPs 1-4 will be in the Test Logic Reset state of FIG. 9. The IC's 1149.1 test bus pins will also be in Test Logic Reset state as driven by the external test controller. When the test bus moves from Test Logic Reset to Run Test/Idle, all the TAP controllers of TAPs 1-4 will follow the test bus. However when the test bus moves from Run Test/Idle to Select DR Scan, only the TAP controller of TAP1 (TAP1 is enabled at reset to be the linked TAP as previously described) will follow. The other TAP controllers of TAPs 2-4 will remain in Run Test/Idle because their enable inputs EN2-4 are low. TAP1 will continue following the test bus until another TAP is enabled by scanning the TLM 21. When the TLM 21 is scanned, the new enable and TAPSEL0,1 control will be updated from the TLM 21. For example if TAP2 is the new TAP to be selected, the EN1 for TAP1 will go low and the EN2 for TAP2 will go high in the UpdateDR state. Also, the TAPSEL0,1 outputs will change to output TDO2 from multiplexer 23. When the enable outputs from the TLM 21 change, the TAP controller of TAP1 will see a low on EN1 and it will be forced to transition from the UpdateDR state to the Run Test/Idle regardless of the logic level on TMS. When the TAP controller of TAP2 sees a high on EN2, it will be enabled to either (1) transition from the Run Test/Idle state to the Select DR Scan state if TMS is high, or (2) remain in the Run Test/Idle state it TMS is low. So while a TAP being unlinked is forced to transition from the UpdateDR state to the Run Test/Idle state regardless of the logic level on TMS, a TAP being linked can either stay in the Run Test/Idle state if the next state of the test bus is the Run Test/Idle state (TMS=0), or transition to the Select DR Scan state if the next state of the rest bus is the Select DR Scan state (TMS=1).

Figure 9A:
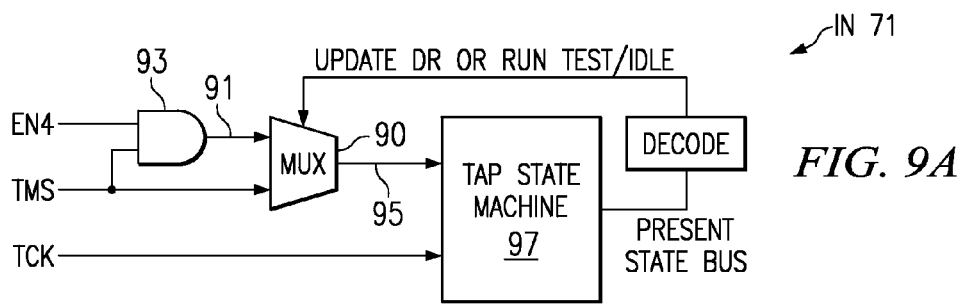
FIG. 9A illustrates in more detail a portion of the TAP controller of FIG. 7.

FIG. 9A shows an example of how TAP controller 71 of FIG. 7 can use the EN4 signal to realize the state diagram of FIG. 9. The TAP state machine circuit 97 of FIG. 9A can be the conventional 1149.1 TAP state machine that implements the state diagram of FIG. 14. However, the input 95 where TMS is conventionally applied to the state machine is connected in FIG. 9A to the output of a multiplexer 90 whose data inputs are TMS and the output 91 of an AND gate 93 whose inputs are TMS and EN4. The multiplexer 90 is controlled to select AND gate output 91 when the decoded state of the TAP state machine is Update DR or Run Test/Idle, and to otherwise select TMS.

Figure 12:
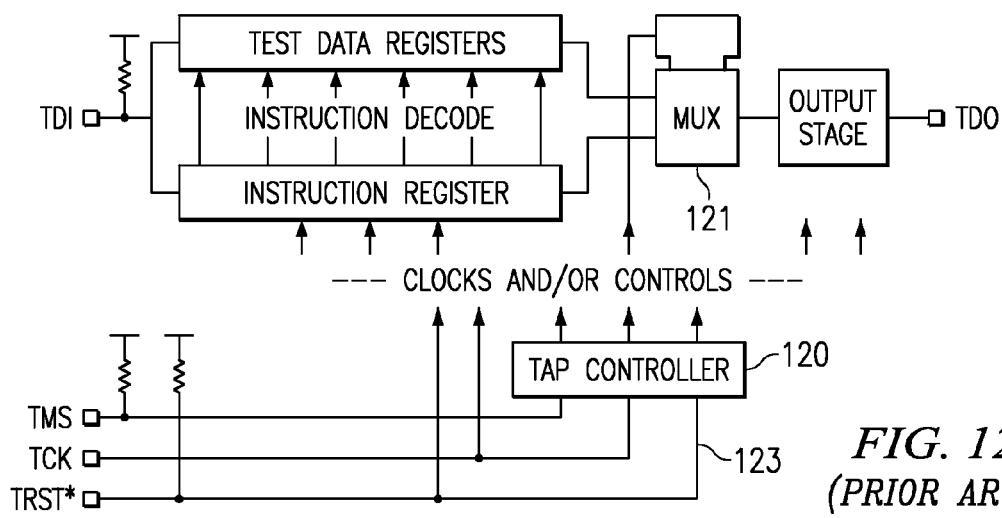
FIG. 12 illustrates the architecture of a conventional 1149.1 TAP.

Apart from the improvements associated with FIGS. 7-9A (and FIG. 17 below), TAPs 1-4 of FIGS. 2 and 5 can otherwise conform to the conventional 1149.1 TAP design of FIG. 12. In fact, the TAP controller 71 of FIGS. 7-9A will operate as conventional 1149.1 TAP controller 120 of FIG. 12 if EN4 is tied high. Note that input 73 of TAP controller 71 corresponds to the TRST* input of conventional TAP controller 120 (see FIG. 12).

Figure 10:
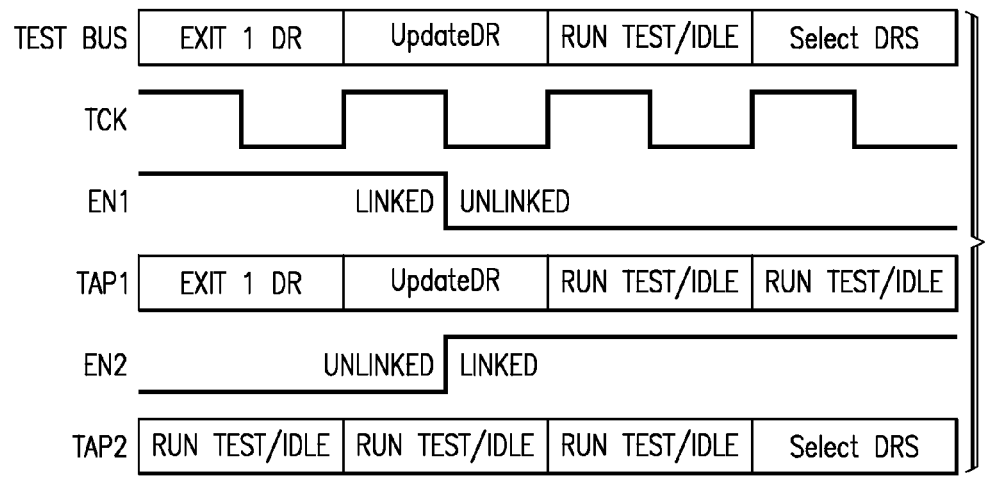
FIGS. 10-11 are timing diagrams which illustrate examples of how the TAPs of FIGS. 2 and 5 can be synchronously linked to and unlinked from the test bus of FIGS. 2 and 5.
Figure 11:
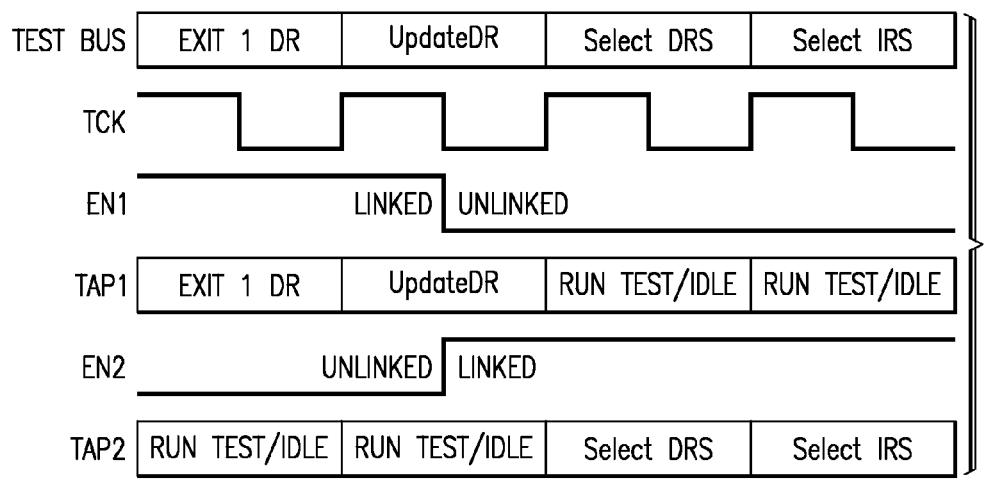

The examples in FIGS. 10 and 11 illustrate two ways a TAP can be synchronously linked to the test bus 13. The FIG. 10 example shows how a TAP is synchronously linked to the test bus 13 when the test bus transitions from UpdateDR to Run Test/Idle state. The FIG. 11 example shows how a TAP is synchronously linked to the test bus 13 when the test bus transitions from UpdateDR to Select DR Scan.

FIG. 10 shows a timing example wherein unlinked TAP2 becomes linked and linked TAP1 becomes unlinked while the test bus transitions from the UpdateDR state to the Run Test/Idle state to the Select DR Scan state. The link change occurs on the falling edge of the TCK in the UpdateDR state with EN1 of TAP1 going low and EN2 of TAP 2 going high. On the next rising TCK edge, the test bus transitions into the Run Test/Idle state, TAP1 (now unlinked) is forced to transition to Run Test/Idle (see FIG. 9), and TAP2 (now linked) remains in Run Test/Idle (see FIG. 9). On the next rising TCK edge, the test bus transitions to the Select DR Scan state, TAP2 transitions with the test bus to the Select DR Scan state, and TAP1 remains in the Run Test/Idle state.

FIG. 11 shows a timing example wherein unlinked TAP2 becomes linked and linked TAP1 becomes unlinked while the test bus transitions from the UpdateDR state directly to the Select DR Scan state. The link change occurs on the falling edge of the TCK in the UpdateDR state with EN1 of TAP1 going low and EN2 of TAP2 going high. On the next rising TCK edge, the test bus transitions into the Select DR Scan state, TAP1 is forced to transition to Run Test/Idle (see FIG.

9), and TAP2 transitions with the test bus from Run Test/Idle to the Select DR Scan state (see FIG. 9). On the next rising TCK edge, the test bus transitions to the Select IR Scan state, TAP2 transitions with the test bus to the Select IR Scan state, and TAP1 remains in the Run Test/Idle state.

After completing all TAP accesses, the test bus can transition to the Test Logic Reset state. TAP(s) currently linked to the test bus will follow it into the Test Logic Reset state. TAP(s) not linked to the test bus (i.e. TAPs unlinked and left in Run Test/Idle state) will be forced to the Test Logic Reset state by the Reset output from the TLM TAP Controller 31 (FIGS. 3 and 4) which always follows the test bus transitions and will output the Reset signal to all TAPs (see FIGS. 2-5) when the test bus enters the Test Logic Reset state.

To provide flexibility in using TLM 21 or TLM 51 to enable and disable TAPs within an IC, the TLMs should preferably be selectable during some or all of the instructions defined for each TAP. For example, the 1149.1 standard defines the following list of required and optional TAP instructions: Bypass, Extest, Sample/Preload, Intest, RunBist, Clamp, Highz, Idcode, and Usercode. During Bypass, Sample/Preload, Idcode, and Usercode instructions, the functional circuit associated with the TAP remains in its normal operation mode. During Extest, Intest, RunBist, Clamp, and Highz instructions, the functional circuit associated with the TAP is disabled from its normal operation mode. Users of the 1149.1 standard may define and add instructions to achieve customized test operations, such as internal scan, emulation, or on-line BIST.

The flexibility of using the TLMs is enhanced if each of the aforementioned conventional instructions is replaced by a pair of instructions according to the present invention, which pair of instructions determine whether or not the TLM is selected. For example, the conventional Extest instruction selects the boundary scan register to scan data between the IC's TDI and TDO pins, but does not at all comprehend the select output SEL4 shown in FIG. 7. Accordingly, one instruction of the Extest replacement pair would (1) select the boundary scan register like the conventional Extest instruction, (2) inactivate the SEL4 output to deselect the TLM, and (3) otherwise affect the IC the same as the conventional Extest instruction. Another instruction of the Extest replacement pair would (1) deselect the boundary scan register, (2) activate SEL4 to select TLM for scanning, and (3) otherwise affect the IC the same as the conventional Extest instruction.

One advantage is that TLM can be operated to disable one TAP and enable another while maintaining the effect of the current instruction on the functional circuit associated with the TAP being disabled. For example, in FIGS. 2 and 5 it may be desirable to disable the IC's I/O while performing a test or emulation operation on MM1. To do this, TAP1 would be enabled and scanned with a Highz instruction version that selects the TLM and deselects the bypass register but otherwise affects the IC the same as the conventional Highz instruction, which will disable the IC's I/O. Next, a data register scan to the TLM disables scan access to TAP1 and enables scan access to TAP2 to enable the desired test or emulation operation on MM1. While test or emulation occurs on MM1, the Highz instruction version, left in effect in TAP1, keeps the IC's I/O disabled. Other 1149.1 instructions or user defined instructions can be similarly replaced by a first instruction that deselects TLM and selects a data register within the TAP and a second instruction that deselects the TAP data register and selects the external TLM, both replacement instructions otherwise affecting the IC the same as the corresponding conventional instruction.

Figures 16, 16A:
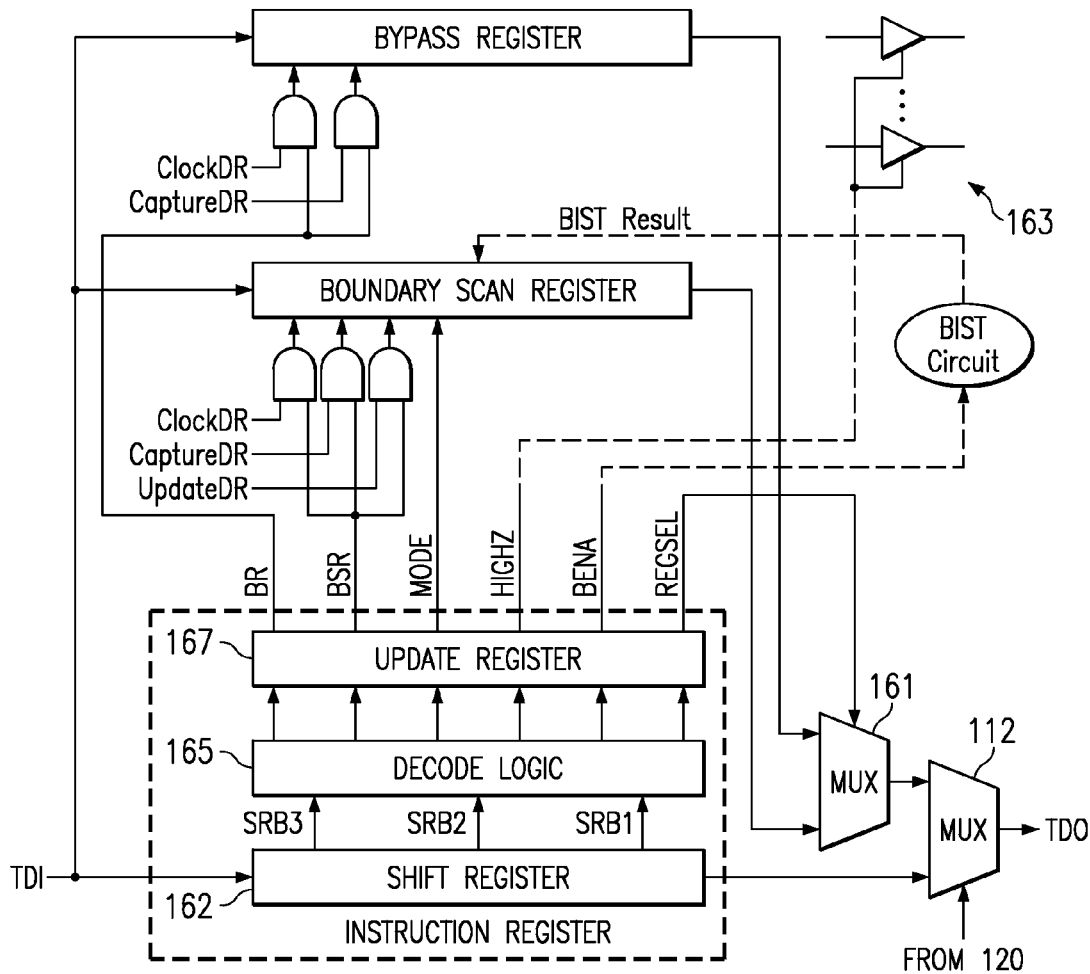
FIG. 16 illustrates in greater detail a portion of prior art FIG. 12.
FIG. 16A illustrates conventional instructions associated with the architecture of FIG. 16.
Figures 17, 17A:
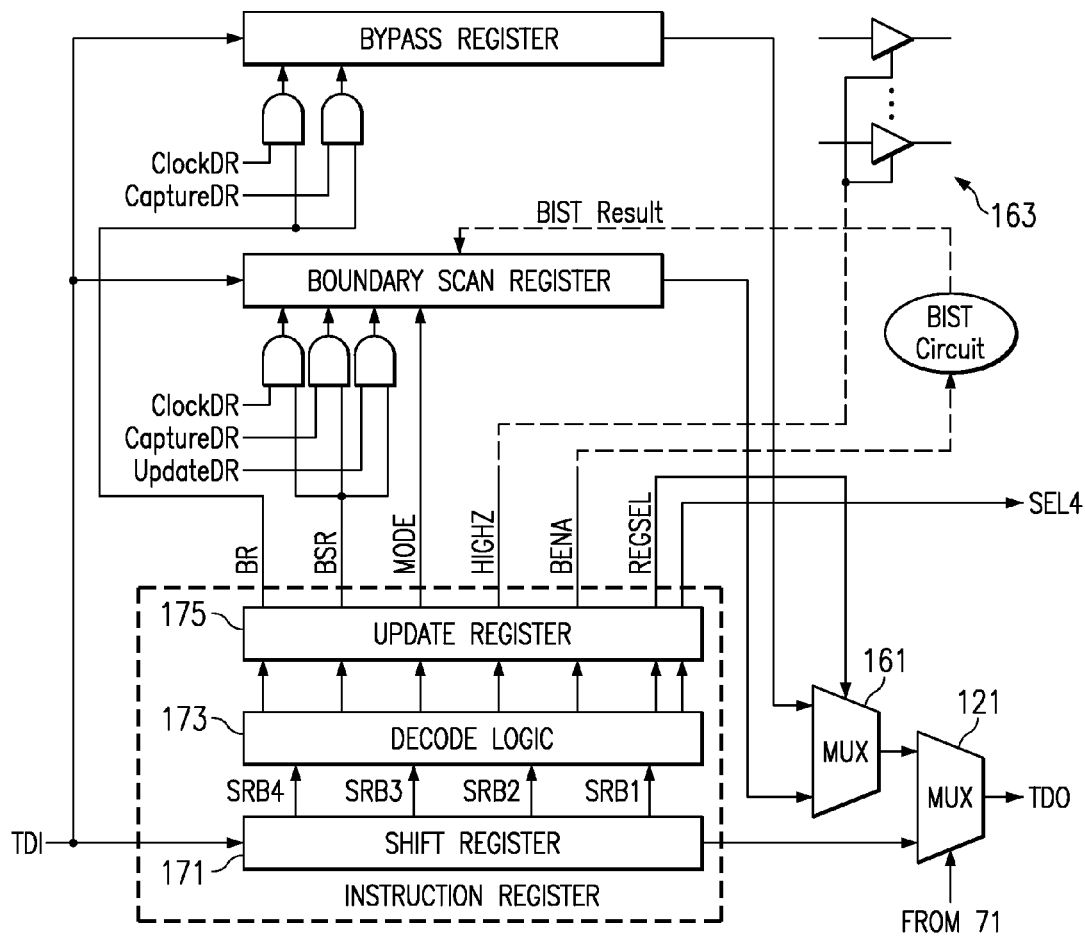
FIG. 17 illustrates in greater detail a portion of TAP4 from FIG. 7.
FIG. 17A illustrates a set of instruction pairs associated with the architecture of FIG. 17.

Example FIGS. 16-17A illustrate the above-described replacement of a given conventional instruction with a pair of replacement instructions which select or deselect TLM. FIG. 16 illustrates various functions which are controlled by the instruction register in the conventional IEEE STD 1149.1 architecture of FIG. 12. In FIG. 16, an instruction is shifted into the shift register 162, and shift register bits SRB3, SRB2, and SRB1 (i.e. the instruction) are then decoded by decode logic 165. The output of the decode logic is loaded into an update register 167 whose outputs control various functions in the test architecture. In the FIG. 16 example, six signals are output from the update register to control the various functions. Signal BR enables the bypass register to scan data therethrough, signal BSR enables the boundary scan register (BSR) to scan data therethrough, the MODE signal applied to BSR determines whether BSR is in a test mode for handling test data or a transparent mode for passing normal functional signals therethrough, the HIGHZ signal can disable the output buffers 163 of the integrated circuit or core megamodule, the BENA signal is a Bist enable signal for enabling Bist operations, and the REGSEL signal controls multiplexer 161 to determine which data register (in this example the bypass register or BSR) will be connected to the input of multiplexer 121, which in turn determines whether a data register or the instruction register will be scanned.

FIG. 16A shows conventional instructions for use with the conventional architecture of FIG. 16. Each of the instructions is decoded to produce the indicated logic levels on the six control signals of FIG. 16. For example, the HighZ instruction enables the bypass register for scanning (BR=1) disables BSR for scanning (signal BSR=0), places BSR in the transparent mode (MODE=0), disables the output buffers 163 (HIGHZ=1), disables Bist (BENA=0), and selects the bypass register at multiplexer 161 (REGSEL=0). As another example, the conventional Extest instruction disables the bypass register for scanning (BR=0), enables BSR for scanning (signal BSR=1), places BSR in the test mode (MODE=1), enables the output buffers 163 (HIGHZ=0), disables Bist (BENA=0), and selects BSR at multiplexer 161 (REGSEL=1).

Exemplary FIG. 17 illustrates in more detail the instruction register control within TAP4 of FIG. 7 according to the present invention. The remaining TAPs 1-3 can be designed analogously. The update register 175 of FIG. 17 outputs the six control signals of FIG. 16 plus the signal SEL4 to select TLM. The shift register 171 of FIG. 17 has an additional shift register bit SRB4 because the six example instructions from FIG. 16A require twelve replacement instructions according to the present invention as shown in FIG. 17A. The additional bit SRB4 is thus needed to uniquely encode the twelve instructions of FIG. 17A.

Referring to FIG. 17A the replacement pair for the conventional HighZ instruction is seen at the third and ninth entries of the table of FIG. 17A. More specifically, the HighZ instruction with TLM not selected is decoded at 173 (see FIG. 17) to output the same logic levels as the conventional HighZ instruction and additionally to output a logic 0 on the SEL4 output in order to ensure that TLM is not selected. The decoded output of the HighZ instruction with TLM selected is the same as the decoded output of the HighZ instruction with TLM not selected, except BR=0 and SEL4=1 to ensure that TLM is selected and the bypass register is deselected. Similarly, the decoded output of the Extest instruction with TLM not selected includes the same six logic levels as the conventional Extest instruction, plus a logic 0 on SEL4 to ensure that TLM is not selected. The decoded output of the Extest instruction with TLM selected is the same as the decoded output of Extest with TLM not selected, except the BSR signal is at logic 0 to deselect BSR, and SEL4=1 to select TLM. Thus, the above-described instruction pairs and the other instruction pairs shown in FIG. 17A permit selection of either TLM or an internal data register (such as the bypass register or BSR) for scanning, but both instructions of each instruction pair otherwise provide the identical control signals provided by the corresponding conventional instructions illustrated in FIG. 16A. Thus, the instruction pairs of FIG. 17A permit TAP4 to select for scanning either the external data path in TLM, or an internal data register such as the bypass register or BSR, while otherwise outputting control signals which are identical to those associated with the corresponding conventional instructions of FIG. 16A.

Execution of RunBist operations is improved by using the RunBist replacement instructions. The conventional RunBist instruction initiates a Bist (Built-In-Self-Test) operation when the TAP enters Run Test/Idle, but the conventional RunBist instruction selects a data register inside the TAP (boundary scan register in FIGS. 16-17) for scanning A first TAP can be enabled and scanned with the replacement RunBist instruction that selects the TLM and deselects the boundary scan register. After scanning the TLM to enable a second TAP, the first TAP gets disabled and automatically transitions into the Run Test/Idle state (FIGS. 9-11) where the replacement RunBist instruction takes effect to initiate the Bist operation. While the first TAP is executing the Bist operation in Run Test/Idle, the second TAP can be scanned with the aforementioned replacement RunBist instruction that selects the TLM and deselects the boundary scan register. Scanning the TLM to enable a third TAP will force the second TAP to the Run Test/Idle state where the replacement RunBist instruction takes effect to initiate a Bist operation. This scheme can continue to sequentially select TAPs and initiate Bist testing in as many TAPs as desired. Thus, BIST operations in the selected megamodules can occur in time overlapping fashion rather than purely sequentially. This of course provides time savings.

To obtain the Bist result from BSR of FIG. 17, TAP4 can be enabled via TLM, and then loaded with the replacement RunBist instruction that deselects TLM and selects BSR. With BSR selected, the Bist result can be scanned out of BSR by a data register scan operation.

The architecture of FIG. 5 can also execute the above procedure to initiate multiple RunBist operations, or it could simply enable/link all or selected ones of the TAPs together, scan in a conventional RunBist instruction to each, then enter Run Test/Idle to concurrently execute the RunBist instructions. After linking a first group of TAPs together in FIG. 5, each of them can be loaded with the replacement RunBist instruction that selects TLM 51, and thereafter the first group can be unlinked via TLM 51 so the first group can execute Bist operations in Run Test/Idle while TLM 51 is linking a second group of TAPs to repeat the same procedure. So while the FIG. 2 architecture allows for enabling a TAP, loading RunBist, and then disabling the TAP to effect Bist operations in a megamodule, the FIG. 5 architecture allows enabling/linking a group of TAPs, loading RunBist, and then disabling/unlinking the group of TAPs to effect concurrent Bist operations in a group of megamodules. The capability of sequentially selecting groups of TAPs so that each group performs Bist operations concurrently within the group and in time-overlapping fashion relative to other groups provides additional flexibility to choose the most time-efficient approach for a given IC's megamodule layout.

Although providing a replacement instruction pair for each instruction will allow for leaving any instruction in effect after a TAP has been disabled, a single instruction can be defined to select the TLM if desired. When using a single TLM select instruction, the TAP cannot maintain the effect of a specific instruction on the IC when the TLM is accessed.

The TAP linking approach described herein could be accomplished on a substrate (e.g. multichip module or board) comprising individual circuits (e.g. die or IC), each having a TAP with externally accessible select and enable signals corresponding to SELL-4 and EN1-4. Also required on the substrate would be a TLM circuit (e.g. die or IC). Further, to support the plural TAP linking scheme of FIG. 5, multiplexer circuits (e.g. die or IC) would be required on the TDI inputs of some or all of the TAP'ed circuits.

Figure 18:
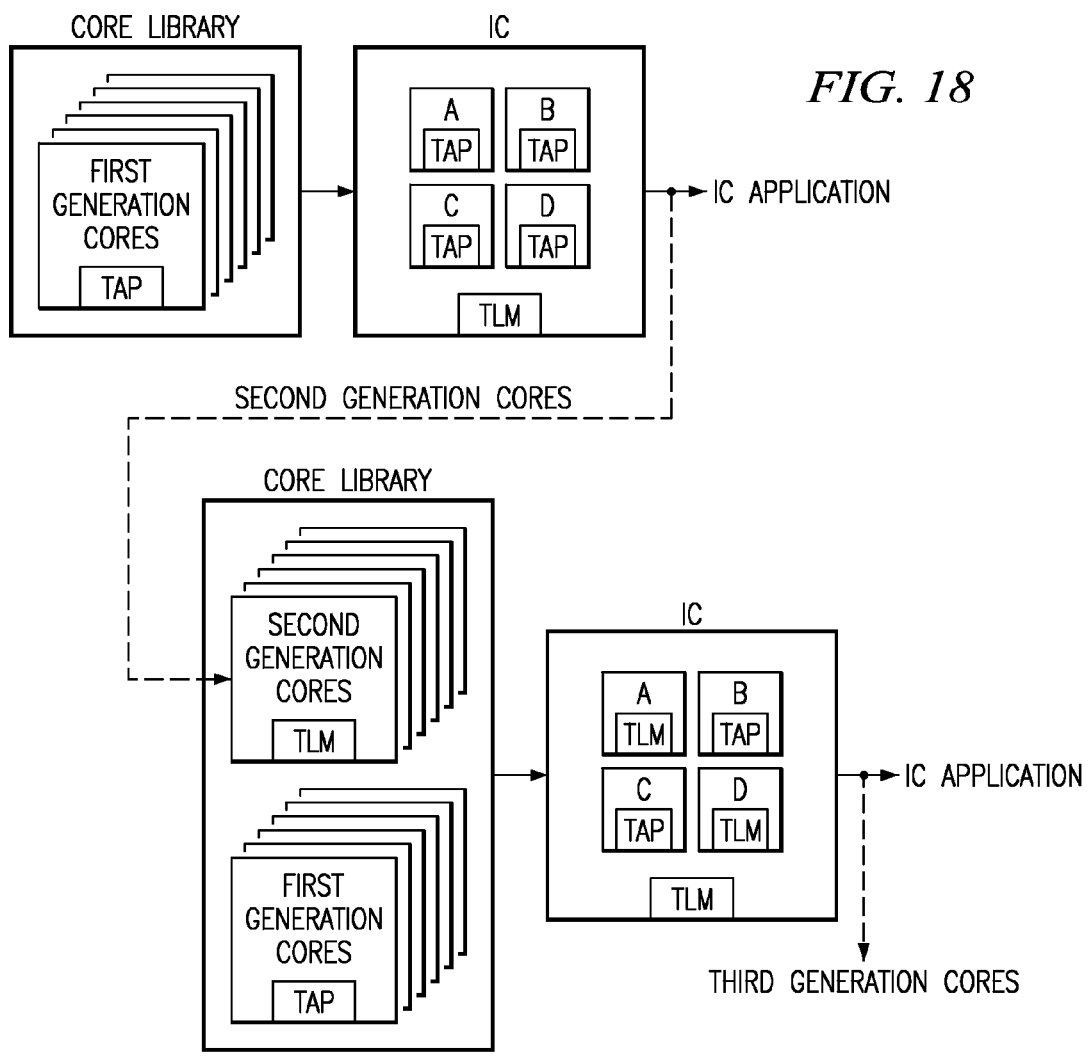
FIG. 18 is an electrical diagram, in block form, illustrating the use of embedded core circuitry in successive generation designs.

FIG. 18 shows an integrated circuit (IC) being designed from a library of first generation cores. The library contains circuit cores of many types such as DSPs, CPUs, Memories, I/O peripherals, A/D's, D/A's, etc. The first generation cores in the library can be selected and placed in the IC. The IC will serve as an application in a larger electronic system. In this example, each of the first generation cores is assumed to contain an 1149.1 TAP for test/emulation access. The IC contains a TLM, which has been previously described hereinabove, to provide access to one of more of the TAP'ed cores in the IC to facilitate test and emulation of the cores and IC. The use of pre-existing cores from the library allows highly complex IC applications to be designed quickly due to the reuse of the first generation core functions contained within the library.

If the IC application of FIG. 18 is popular, it may evolve into a second generation core as shown by the dotted line feeding into the larger library to allow its reuse within another IC. When the IC becomes a core, its TLM based test architecture will be maintained to enable reuse of the IC's test and emulation mechanisms at the core level. Further seen in FIG. 18 is the creation of an even more complex IC application which uses both first and second generation cores from the larger library. The IC also includes a TLM to provide access to the TAP'ed and TLM'ed cores. Additionally, it is seen that the more complex IC application may evolve into a third generation core which will go into an even larger core library.

What FIG. 18 indicates is a trend of how ICs designed from cores, will themselves become cores for use in larger, more complex ICs. This continuing generation of larger, more complex cores will put an increasing burden on test and emulation at the IC level. The TLM invention described hereinabove addresses test and emulation access of ICs designed from first generation cores, i.e. TAP'ed cores. The following description illustrates how the TLM described hereinabove can also provide hierarchical test and emulation access to second, third, and further core generations used inside an IC.

Figure 19:
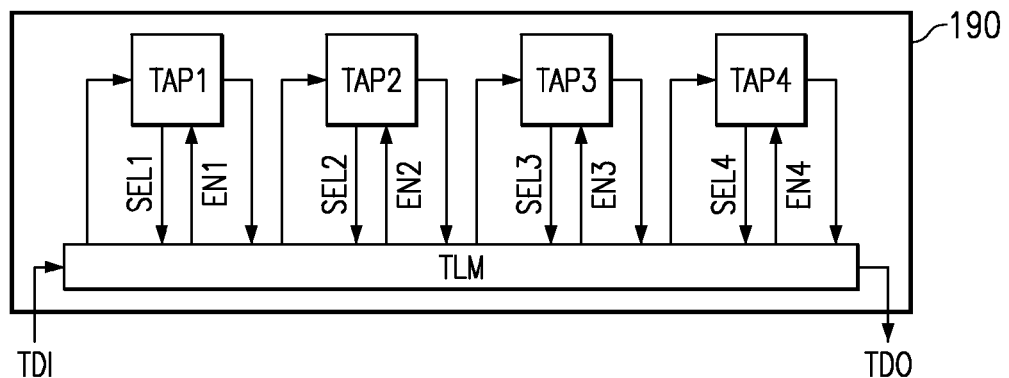
FIG. 19 is an electrical diagram, in block form, illustrating an integrated circuit arrangement with multiple test access ports (TAPs) controlled by a TAP linking module (TLM).

FIG. 19 shows an IC 190 with a TLM architecture including TAP domains 1-4 (as described previously in regard to FIG. 2). The term domain is used to indicate circuit regions within the IC where the TAPs provide test and/or emulation access and control. For example, TAP1 provides control and access of circuitry within the IC domain, such as the IC's boundary scan register, test data registers, and built in self test circuitry (BIST), as described in IEEE standard 1149.1. TAP2 provides control and access of circuitry within the MM 1 core domain. Similarly, TAPs 3 and 4 provide control and access of circuitry within the MM2 and MM3 core domains, respectively. The TAP accessible circuitry within each core domain can include; the core's boundary scan register, test data registers, and BIST circuitry, again as described in IEEE standard 1149.1. Further, all TAPs 1-4 may provide control and access of additional circuitry within each of their respective domains which is not described or anticipated by IEEE standard 1149.1. For example, a domain may contain emulation circuitry which is accessible via a TAP. According to the TAP connectivity arrangement made possible by the TLM of FIG. 19, emulation circuitry residing within a given TAP domain may accessed and operated independently of emulation circuitry within other TAP domains, or in cooperation with emulation circuitry residing within other TAP domains.

For simplification, the TLM block of FIG. 19 has been expanded to include the TAP Linking Module, multiplexers and wiring interconnect of FIG. 2. Also for simplification, the TCK, TMS, and TRST test bus signals of FIG. 2 are not shown in FIG. 19. The operation of the TLM of FIG. 19 is otherwise the same as previously described in regard to FIG. 2. That being that at power up, TAP1 (the ICs BSR TAP) is enabled by the TLM while the other TAPs 2-4 (of cores MM1-3) are disabled by the TLM. Following powerup, TAP1 can select any other TAP to become the enabled TAP, and that TAP can likewise select another TAP to be enabled, and so on. If the IC of FIG. 19 will become a core, then the TLM is modified as follows to allow it to be used hierarchically inside an IC to control and access circuitry within its domain.

Figure 20:
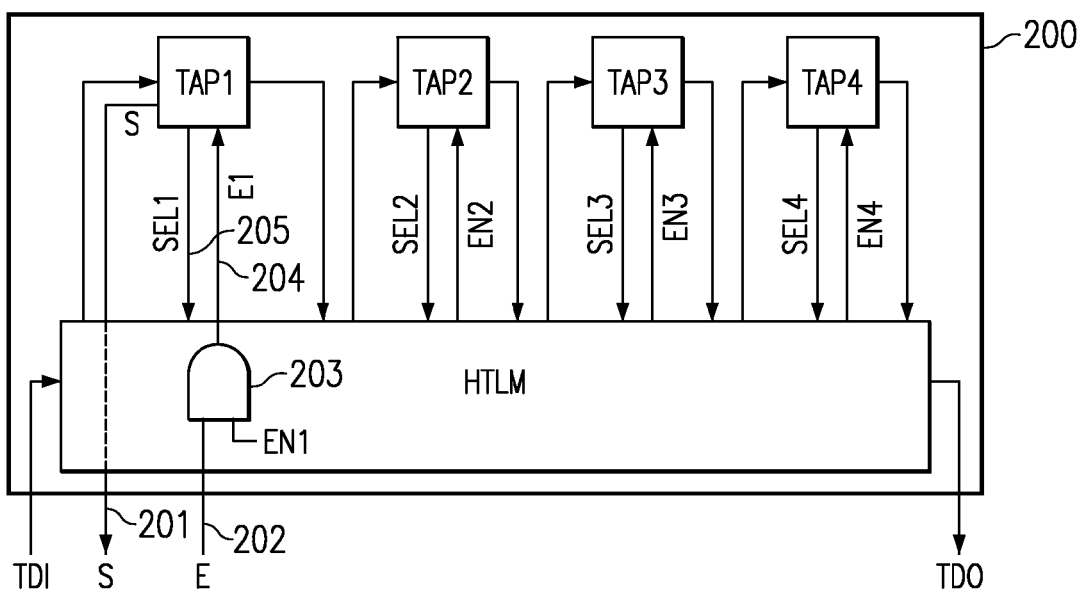
FIG. 20 is an electrical diagram, in block form, illustrating an integrated circuit arrangement in which hierarchical TAP access is enabled.

The changes to the IC 190 TLM architecture in FIG. 19 to produce the core 200 hierarchical TLM (HTLM) architecture of FIG. 20 includes; (1) TAP1 is expanded to include an additional select output (S) 201 that passes through the HTLM as an external core output, (2) an external enable (E) 202 core input is added and input to the HTLM, and (3) an AND gate (&) 203 is added to the HTLM. The AND gate is inserted into the EN1 signal path between the TAP Linking Module and TAP1 of FIG. 2. The AND gate receives as input the EN1 signal from the Link Update Register of FIG. 3 and the enable input 202 of FIG. 20. The AND gate output 204 is input to the enable input (E1) of TAP 1. The TAP 1 enable input E1 is the same as the TAP1 EN 1 input previously shown in FIG. 2, with the exception that it now comes from the output of AND gate 203, instead of directly from the EN1 output of the Link Update Register of FIG. 3.

At power up, the EN1 signal from the Link Update Register is set high to enable TAP1, as previously described in regard to FIG. 2. However in FIG. 20 it is seen that if enable 202 is low, TAP1 will not be enabled since the enable 204 input to TAP1 is gated low by enable 202. So enable 202 provides an externally accessible input which can disable (if low) or enable (if high) TAP1. When using HTLM'ed cores within an IC, the ability to control the HTLM's externally accessible enable 202 input is key to providing hierarchical test and emulation access to HTLM'ed cores. For example, if the HTLM of core 200 is enabled (by enable input 202) it provides test and/or emulation access to its TAP circuit domains, as previously described in regard to FIG. 2. When access of the HTLM's TAP circuit domains is complete, TAP1 is selected as the enabled TAP. Scanning an instruction into TAP1 can set the select signal 201 high to select scan access to an HTLM external to core 200. Scanning data into the external HTLM can set the enable signal input 202 of FIG. 20 low which disables the internal HTLM of FIG. 20, as described above.

The instruction scanned into TAP1 to set the external select output 201 high must also set the internal select output 205 low, so that during the data scan operation, the internal HTLM of FIG. 20 will not be scanned while the external HTLM is being scanned. Likewise, instructions scanned into TAP1 to set the internal select 205 output high to access the internal HTLM must also set the external select 201 low so that the external HTLM is not scanned during data scans to the internal HTLM.

Figure 21:
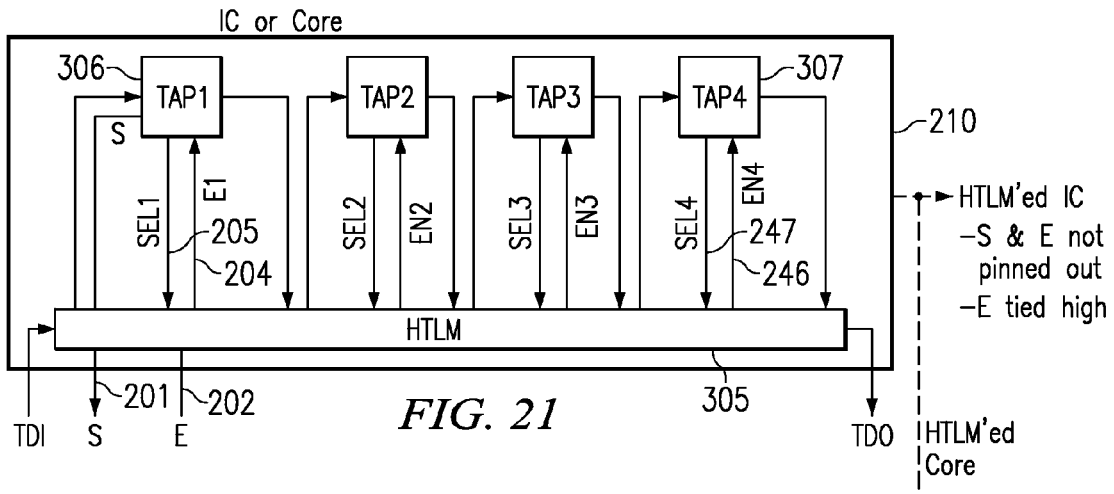
FIGS. 21 through 23 are electrical diagrams, in block form, illustrating the hierarchical arrangement of embedded cores with multiple TAPS, according to the preferred embodiment of the invention.
Figure 22:
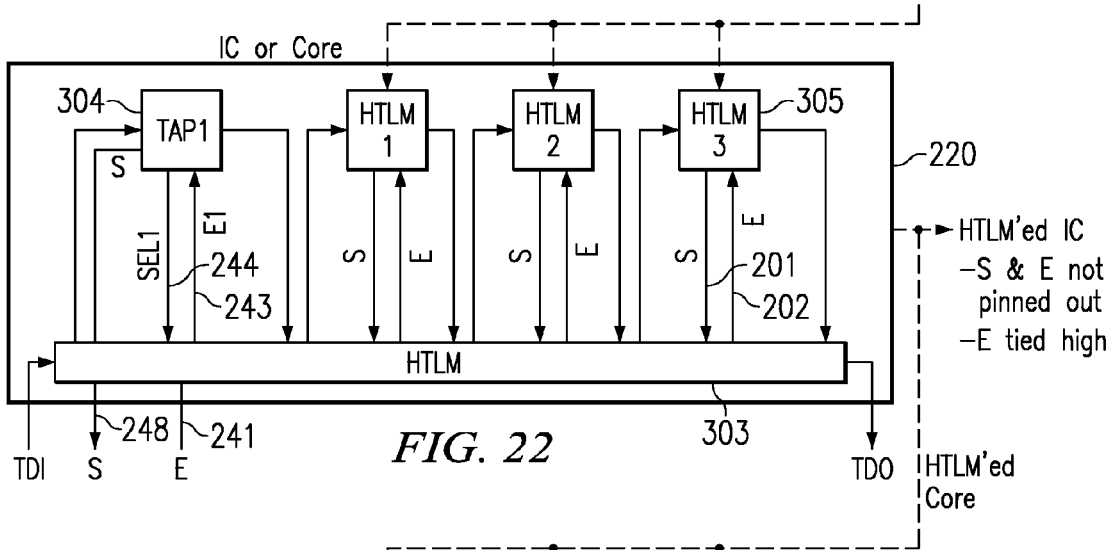
Figure 23:
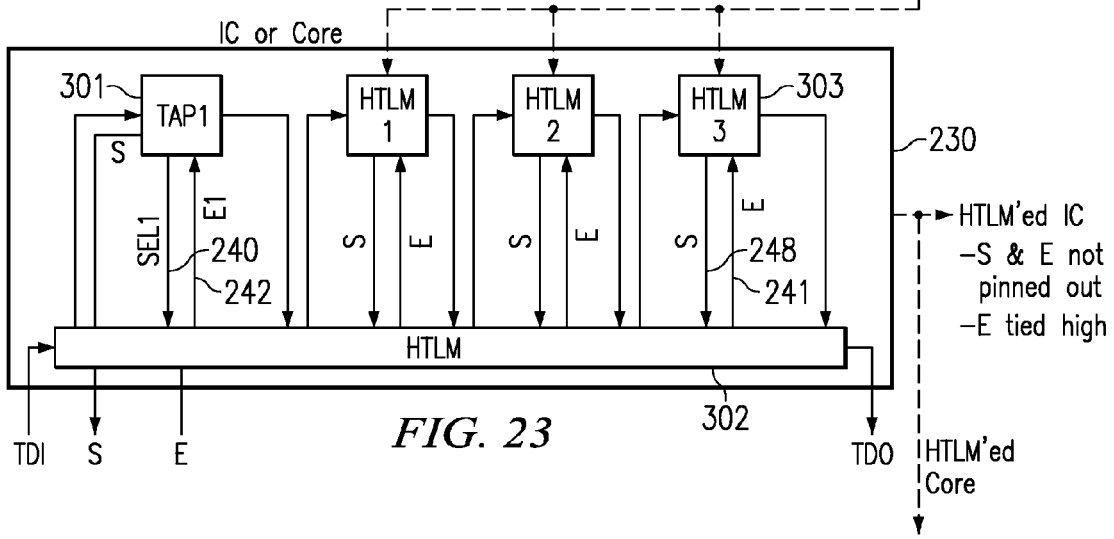

FIGS. 21 through 23 illustrate the hierarchical access of HTLM'ed cores within ICs or cores using the additional externally accessible select and enable signals described above. FIG. 21 illustrates the IC or core design 200 of FIG. 20. In the IC case, the externally accessible select (S) and enable (E) signals are not required to be pinned out, while they could be if the IC user desired their capabilities at the board or MCM level. If not pinned out, the enable signal (E) is wired or pulled high to force the HTLM to always be enabled, and the select signal (S) is not connected. In this case the HTLM operates as would the previously described TLM.

FIG. 22 illustrates a case where three copies of the FIG. 21 HTLM'ed core design 200 are used inside another IC or Core design 220. In FIG. 22, the select and enable signals of each HTLM core design 200 are shown connected to the HTLM of the IC or core design 220. In this arrangement, the previously described method of accessing the core's HTLM by an external HTLM, using the select and enable signals, is made more clear. Again, if the FIG. 22 circuit is used as an IC, the externally accessible select signal is not connected and the enable signal is wired or pulled high. FIG. 23 illustrates a case where three copies of the FIG. 22 HTLM'ed core design 220 are used inside another IC or core design 230. In FIG. 23, the select and enable signals of the FIG. 22 HTLM's are shown connected to the HTLM of the IC or core design 230.

It is clear from FIGS. 21 through 23 that the HTLM can be reused over and over again without modifying its basic interface to provide hierarchical test and emulation access to cores deeply embedded within ICs or cores. It is seen, in IC design 230 of FIG. 23, that at power up, HTLM 302 enables TAP1 301 and disables the three HTLM'ed cores. This allows access to the IC's boundary scan register upon power up, as required by IEEE standard 1149.1. Access to the HTLMs occurs as previously mentioned, wherein TAP1 selects HTLM 302 for scanning to disable TAP1 301 and enable an HTLM.

The following example is given to illustrate the hierarchical access steps that can be used to allow HTLM 302 of the IC of FIG. 23 to access the embedded core TAP4 307 of FIG. 21. At power up, TAP1 301 of the IC of FIG. 23 is enabled (IC's enable (E) wired or pulled high as mentioned above). TAP1 301 can be scanned with an instruction that selects, via SEL1 240, HTLM 302 for scanning. Scanning data into HTLM 302 enables the core HTLM 303 domain, via E 241, and disables TAP1 301, via E1 242. Enabling the core HTLM 303 domain enables TAP1 304, via E1 243. Scanning an instruction into TAP1 304 selects, via SEL1 244, HTLM 303 for scanning. Scanning data into HTLM 303 enables the core HTLM 305 domain, via E 202, and disables TAP1 304, via E1 243. Enabling the core HTLM 305 domain enables TAP1 306, via E1 204. Scanning an instruction into TAP1 306 selects HTLM 305 for scanning, via SEL1 205. Scanning data into HTLM 305 enables the core TAP4 307 domain, via EN4 246, and disables TAP1 306, via E1 204. Following these steps, a hierarchical connection is formed such that the circuits within the TAP4 307 domain can be accessed and controlled for test and/or emulation operations directly from the test interface of the IC 230 of FIG. 23.

After all test and emulation access has been performed on circuits existing within the TAP4 307 domain, an instruction can be scanned into TAP4 307 to select HTLM 305 for scanning, via SEL4 247. Scanning data into HTLM 305 enables TAP1 306, via E1 204, and disables HTLM 307, via EN4 246. Scanning an instruction into TAP1 306 selects HTLM 303 for scanning, via S 201. Scanning data into HTLM 303 enables TAP1 304, via E1 243 and disables HTLM 305, via E 202. Scanning an instruction into TAP1 304 selects HTLM 302 for scanning via S 248. Scanning data into HTLM 302 enables TAP1 301, via E1 242, and disables HTLM 303, via E 241.

This example has demonstrated the ability to extend test access from HTLM 302 of the FIG. 23 IC up into the TAP4 307 domain, execute test or emulation operations on circuits existing within the TAP4 307 domain, then retract test access from the TAP4 307 domain back down to the HTLM 302 of the FIG. 23 IC. The ability to hierarchically extend and retract test access in this manner provides a standard way to provide test and emulation operations on circuits/cores independently of how deeply they may be embedded within a complex IC or core design. The approach uses conventional 1149.1 instruction and data scan operations to achieve this hierarchical access methodology. ICs and cores designed with HTLM interfaces can therefore be reused efficiently. Additionally, since a direct test access mechanism is provided via the HTLMs, embedded cores that evolved from ICs can reuse the test and emulation schemes and pattern sets previously developed and used for the ICs.

FIG. 24 illustrates an example of how the TAP of FIG. 7 can be modified to support the additional select output 201 of FIG. 20 without having to add instructions to the instruction register. The modifications include adding a scan cell 350 in series with the instruction register, but not the data registers, and inserting a demultiplexer 352 in the SEL signal path from the instruction register. Also, the TAP of FIG. 24 represents the TAP1 of FIG. 20, so SEL4 output of FIG. 7 is renamed in FIG. 24 to be SEL1 of FIG. 20 and the EN4 input of FIG. 7 is renamed in FIG. 24 to be E1 of FIG. 20. The scan cell 350 is connected to the instruction scan control that operates the instruction register. In response to the instruction scan control, the scan cell 350 captures data when the instruction register captures data, shifts data when the instruction register shifts data, and updates and outputs data when the instruction register updates and outputs data. When data is being shifted through scan cell 350, its output 351 remains unchanged until after the shift operation is complete and the update operation occurs. An example of the instruction register is shown in FIG. 17. In reference to FIGS. 17 and 24 it is seen that the scan cell 350 output is not input to the decode logic of the instruction register. Therefore, scan cell 350 does not modify the decoded instructions contained within the instruction register.

FIG. 25 illustrates an example circuit for implementing demultiplexer 352 of FIG. 24. The circuit has an input for receiving the SEL output from the instruction register, an input for receiving the address (A) output 351 from scan cell 350, an output for providing the internal HTLM select output 205 (SEL1) of FIG. 20, and an output for providing the external HTLM select output 201 (S) of FIG. 20. When the address input 351 is low, SEL1 is driven by the state of SEL, while S is driven low. When the address input 351 is high, S is driven by the state of SEL, while SEL1 is driven low. This circuit in combination with scan cell 350 allows either the internal or external HTLM to be selected for scanning, but never both at the same time. Also this circuit in combination with scan cell 350 allows the instruction used to set SEL high to be used for selecting either the internal or external HTLM.

Previous description regarding the operation and need for replacement instructions has been given in regard to FIGS. 17 and 17A. For example, in FIG. 17A a normal HighZ instruction produces an effect and selects the bypass register for scanning, while a replacement HighZ instruction produces the same effect but selects the TLM for scanning Using the present invention as shown in FIG. 24, a normal HighZ instruction continues to produce an effect and select the bypass register for scanning, while a replacement HighZ instruction can produce the same effect but, by the data value loaded into scan cell 350, also selects either the internal HTLM for scanning via SEL1, or the external HTLM for scanning via S. Thus the same replacement instruction previously described is made reusable by scan cell 350 and demultiplexer 352 for either selecting the internal or external HTLM. Since the existing replacement instruction is reusable for accessing either the internal or external HTLM, no additional instruction is required for selecting the external HTLM.

Table 1 illustrates an example of how the HighZ, Clamp, and RunBist replacement instructions, previously described in regard to FIGS. 17 and 17A, can be reused for accessing either the internal HTLM or external HTLM. In Table 1, the address (A) column indicates the data bit value shifted into scan cell 350, the instruction column indicates the data bit values shifted into the instruction shift register of FIG. 17, and the SEL column indicates the value of the SEL output from the instruction register of FIG. 17.

In the first row, A=X, instruction=0010, and SEL=0 and the instruction is a normal HighZ instruction with no HTLM selected. In the first row, notice that since the SEL1 and S outputs of demultiplexer 352 are low when SEL is low, A can be a don't care value. In the second row, A=0, instruction=1010, and the instruction is a replacement HighZ instruction with the internal HTLM selected. In the third row, A=1, instruction=1010, and the instruction is a replacement HighZ instruction with the external HTLM selected. By inspection it is seen that if A=0, the replacement HighZ instruction 1010 is used to access the internal HTLM, and if A=1, the replacement HighZ instruction 1010 is used to access the external HTLM. Thus the 1010 HighZ replacement instruction code is reused for accessing either the internal or external HTLM, as determined by the value of the data bit shifted into scan cell 350. The other two example instructions illustrate how the Clamp and RunBist replacement instruction codes, 1011 and 1100 respectively, are similarly made reusable by the value of the data bit shifted into scan cell 350.

This instruction reuse approach provides a way to upgrade TAP1 to support access to external HTLMs without having to modify the design of TAP 1's instruction register. However, the present invention is not dependent upon this instruction reuse approach and it should be clearly understood that the instruction register may be redesigned to include additional instructions for accessing external HTLMs instead of using the instruction reuse approach described above.

While a single scan cell 350 is used in FIG. 24 to allow demultiplexing the SEL output into two output signals, SEL1 and S, additional scan cells could be added in series with the instruction register and connected to a larger output demultiplexer to allow increasing the number of output signals. For example, two scan cells and a 1 to 4 demultiplexer would allow the SEL output to be connected to four outputs.

Some microprocessor and digital signal processor ICs utilize the 1149.1 TAP for performing scan based emulation and debug. During emulation and debug, serial data is communicated to the processor via the TAP pins. The data communicated to the processor can be used to establish various emulation and debug modes, breakpoint conditions, and non-intrusive system observation functions (for example, as described in "Pentium Pro Processor Design for Test and Debug", Paper 12.3, 1997 IEEE International Test Conference Proceedings). As these ICs evolve into cores, it is important to maintain access to their TAPs so that emulation and debug can continue to be performed, even when the core is embedded deeply within an IC. The ability of the present invention to provide hierarchical connectivity between the IC pins and the TAPs of embedded cores provides for continued use of scan based emulation and debug.

Using the previous example described in regard to FIGS. 21 through 23, it is clear that TAP 307 of FIG. 21 can be hierarchically connected to the test pins (TDI, TMS, TCK, TRST, and TDO) of the IC in FIG. 23. TAP 307 could be part of a processor core that evolved from an IC. Further, the processor core could have reusable IC emulation and debug features available via TAP 307. Further still, potentially many more TAP'ed cored embedded within the IC of FIG. 23 may have emulation and debug features available via their TAPs. The hierarchical connectivity of the present invention can be used advantageously to provide direct access between the IC test bus pins and core TAPs to enable scan-based emulation and debug features to be performed on embedded cores within an IC.

Although exemplary embodiments of the present invention are described above, this description does not limit the scope of the invention, which can be practiced in a variety of embodiments.

What is claimed is:

1. An integrated circuit comprising:
   A. a test data input lead, a test clock lead, a test mode select lead, and a test data out lead;
   B. a first hierarchical core including:
      i. a first test access port having a test data input coupled to the test data input lead, a test clock input coupled to the test clock lead, a test mode select input coupled to the test mode select lead, and a test data output coupled to the test data out lead, the first test access port including a boundary scan register having a test data input coupled to the test data input lead and a test data output coupled to the test data output lead, the first test access port having a first select S output lead, a select SEL1 output lead, and an enable EN1 input lead;
      ii. first core circuitry having first megamodule circuitry and a second test access port, the second test access port having a test data input coupled to the test data input lead, a test clock input coupled to the test clock lead, a test mode select input coupled to the test mode select lead, and a test data output coupled to the test data out lead, the second test access port including connections to the first megamodule circuitry, a select SEL2 output lead and an enable EN2 input lead; and
      iii. a first test linking module having a test data input coupled to the test data input lead, a test data output coupled to the test data output lead, a clock input coupled to the test clock lead, a test mode select input coupled to the test mode select lead, a select SEL1 input coupled to the select SEL1 output lead, an enable E input, an enable EN1 output coupled to the enable E input and coupled to the enable EN1 input lead, a select SEL2 input coupled to the select SEL2 output lead, and an enable EN2 output coupled to the enable EN2 input lead; and
   C. a second hierarchical core including:
      i. a third test access port having a test data input coupled to the test data input lead, a test clock input coupled to the test clock lead, a test mode select input coupled to the test mode select lead, and a test data output coupled to the test data out lead, the third test access port including a boundary scan register having a test data input coupled to the test data input lead and a test data output coupled to the test data output lead, the third test access port having a second select S output lead, a select SEL3 output lead, and an enable EN3 input lead; and
      ii. a second test linking module having a test data input coupled to the test data input lead, a test data output coupled to the test data output lead, a clock input coupled to the test clock lead, a test mode select input coupled to the test mode select lead, a select SEL3 input coupled to the select SEL3 output lead, an enable EN3 output coupled to the enable EN3 input lead, a select S input connected to the first select S output lead, a second enable E input, and an enable E output connected to the enable E input and coupled to the second enable E input.

* * * * *